(12) United States Patent
Kim

(10) Patent No.: US 11,903,220 B2
(45) Date of Patent: Feb. 13, 2024

(54) ELECTRONIC DEVICE AND METHOD FOR FABRICATING THE SAME

(71) Applicant: SK hynix Inc., Icheon (KR)

(72) Inventor: Hwang Yeon Kim, Icheon (KR)

(73) Assignee: SK hynix Inc., Icheon (KR)

(*) Notice: Subject to any disclaimer, the term of this patent is extended or adjusted under 35 U.S.C. 154(b) by 648 days.

(21) Appl. No.: 17/011,150

(22) Filed: Sep. 3, 2020

(65) Prior Publication Data

US 2021/0391387 A1 Dec. 16, 2021

(30) Foreign Application Priority Data

Jun. 12, 2020 (KR) .................. 10-2020-0071434

(51) Int. Cl.
| | |
|---|---|
| *H10B 63/00* | (2023.01) |
| *H10N 70/00* | (2023.01) |
| *H10N 70/20* | (2023.01) |

(52) U.S. Cl.
CPC ............ *H10B 63/84* (2023.02); *H10B 63/20* (2023.02); *H10N 70/011* (2023.02); *H10N 70/231* (2023.02); *H10N 70/826* (2023.02); *H10N 70/861* (2023.02)

(58) Field of Classification Search
CPC ........ H10B 61/00; H10B 61/10; H10B 63/10; H10B 63/20–24; H10B 63/80–845; H10N 70/011; H10N 70/20; H10N 70/231; H10N 70/826; H10N 70/861; H01L 27/222; H01L 27/224; H01L 27/2409; H01L 27/2418; H01L 27/2427; H01L 27/2463; H01L 27/2481; H01L 43/02; H01L 43/08; H01L 43/12; H01L 45/06; H01L 45/12; H01L 45/1233; H01L 45/128; H01L 45/16
See application file for complete search history.

(56) References Cited

U.S. PATENT DOCUMENTS

| | | | |
|---|---|---|---|
| 2009/0283737 A1* | 11/2009 | Kiyotoshi | ........... H01L 27/1021 257/E47.001 |
| 2010/0187591 A1 | 7/2010 | Nagashima | |
| 2012/0299063 A1* | 11/2012 | Baba | ...................... H10B 63/22 257/E21.004 |

(Continued)

FOREIGN PATENT DOCUMENTS

| | | |
|---|---|---|
| CN | 106611767 A | 5/2017 |
| CN | 107452870 A | 12/2017 |

(Continued)

*Primary Examiner* — Andres Munoz

(57) ABSTRACT

A semiconductor memory includes a substrate including a cell region, first and second peripheral circuit regions disposed on two sides of the cell region; first lines extending across the cell region and a first peripheral circuit region; second lines disposed over the first lines and extending across the cell region and the second peripheral circuit region; a contact plug in the second peripheral circuit region and connected to the second line; third lines disposed over the second lines and respectively overlapping the second lines; and first memory cells disposed in the cell region and located at intersections of the first lines and the second lines between the first lines and the second lines, wherein portions of the third line located in the cell region and over the contact plug contact the second line, and part of a remainder of the third line is spaced apart from the second line.

16 Claims, 20 Drawing Sheets

(56) References Cited

U.S. PATENT DOCUMENTS

| | | | |
|---|---|---|---|
| 2013/0099348 A1* | 4/2013 | Nagashima | H10N 70/063 257/499 |
| 2017/0244031 A1 | 8/2017 | Jeong et al. | |
| 2017/0271580 A1 | 9/2017 | Park et al. | |
| 2018/0018263 A1 | 1/2018 | Cho et al. | |
| 2018/0261622 A1 | 9/2018 | Jiang et al. | |
| 2019/0035798 A1 | 1/2019 | Hwang et al. | |
| 2019/0312049 A1 | 10/2019 | Cheon et al. | |
| 2021/0183949 A1* | 6/2021 | Kim | H10B 63/20 |
| 2021/0183950 A1* | 6/2021 | Cho | H01L 23/535 |

FOREIGN PATENT DOCUMENTS

| | | | |
|---|---|---|---|
| CN | 109686839 A | 4/2019 | |
| KR | 100722769 B1 | 5/2007 | |

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2020-0071434, filed on Jun. 12, 2020, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of improving operating characteristics of a semiconductor memory and simplifying processes, and a method for fabricating the same.

In an embodiment, an electronic device includes a semiconductor memory, which includes: a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a contact plug disposed in the second peripheral circuit region and having an upper surface coupled to the second line; a plurality of third lines disposed over the second lines and respectively overlapping the second lines; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein a first portion of the third line located in the cell region and a second portion of the third line located over the contact plug contact the second line, and at least a part of a remainder of the third line is spaced apart from the second line.

In another embodiment, an electronic device includes a semiconductor memory, which includes: a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a plurality of third lines disposed over the second lines and respectively overlapping the second lines, the third lines partially contacting the second lines in the second peripheral circuit region; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein each of upper and lower surfaces of the second lines includes a protruding portion and a recessed portion in the second peripheral circuit region, and the third lines contact the protruding portion of the upper surface of the second lines.

In another embodiment, a method for fabricating an electronic device comprising a semiconductor memory, includes: providing a substrate which includes a cell region, a first peripheral circuit region disposed at a first side of the cell region in a first direction, and a second peripheral circuit region disposed at a second side of the cell region in a second direction crossing the first direction; forming a plurality of stacked structures, which extend in the first direction across the cell region and the first peripheral circuit region, over the substrate, each of the stacked structures including a first line and an initial first memory cell; forming an interlayer insulating layer filled between the stacked structures and a contact plug passing through the interlayer insulating layer in the second peripheral circuit region, the interlayer insulating layer in the second peripheral circuit region having a recessed portion of which an upper surface is recessed lower than an upper surface of the initial first memory cell, and an upper surface of the contact plug has a height equal to or higher than a height of the upper surface of the initial first memory cell; forming a plurality of second lines extending in the second direction across the cell region and the second peripheral circuit region, and extending over the initial first memory cell, the interlayer insulating layer, and the contact plug, wherein one of the second lines contacts the upper surface of the contact plug; forming first memory cells by etching the initial first memory cell exposed by the second lines; and forming a plurality of third lines respectively overlapping the second lines, wherein a first portion of one of the plurality of third lines located in the cell region and a second portion of that third line located over the contact plug contact the second line, and at least a part of a remainder of the third line is spaced apart from the second line.

These and other aspects, embodiments and associated advantages are described in greater detail in the drawings, the description and the claims.

DETAILED DESCRIPTION

Figure 1:
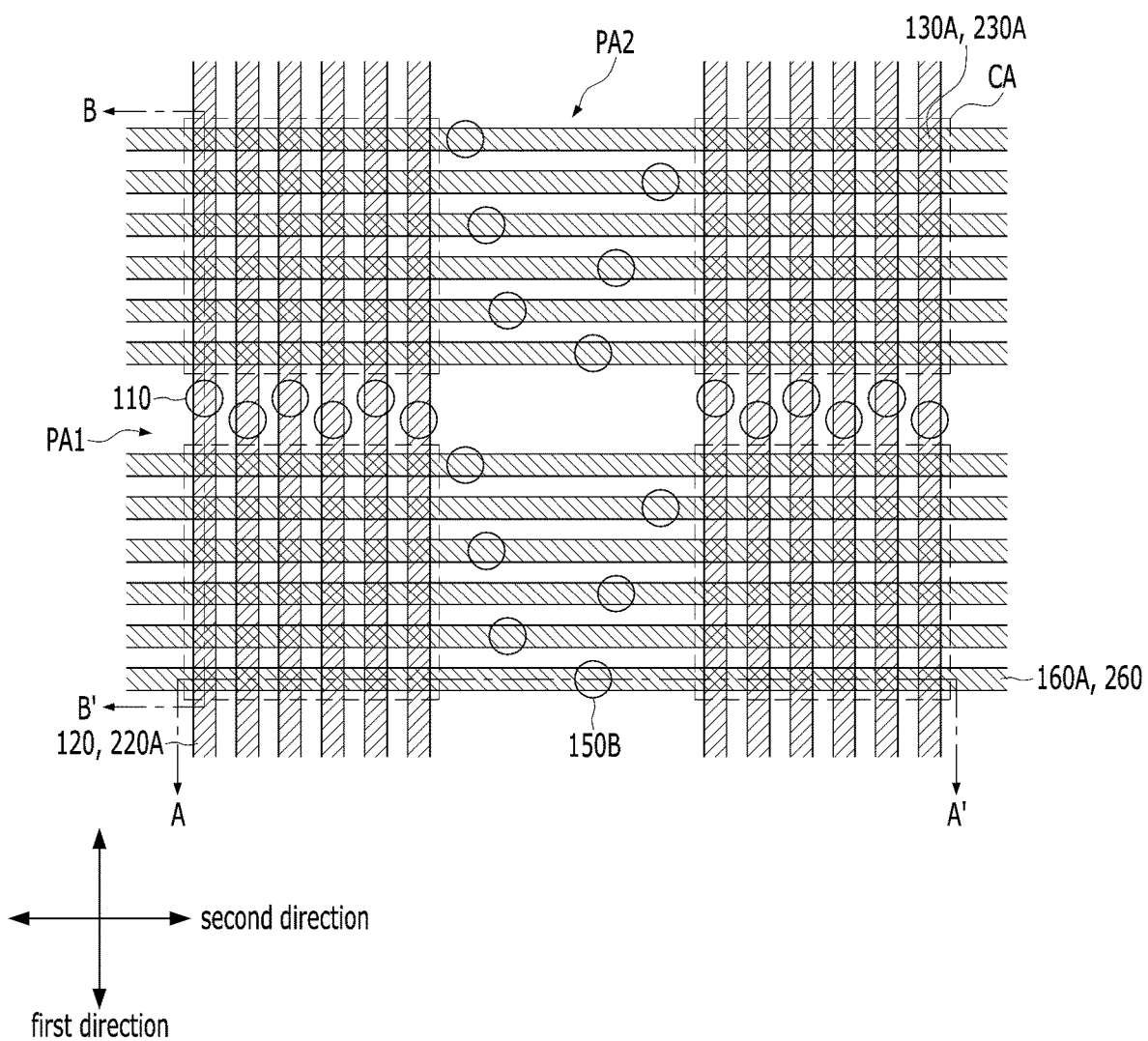
FIGS. 1, 2A-B, 3A-B, 4A-B, 5A-B, 6A-B, 7A-B, 8A-B, 9A-B, 10A-B, and 11A-B are views illustrating a semiconductor memory according to an embodiment of the present disclosure, and a method for fabricating the same.

Various examples and embodiments of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to the description of present embodiments, a semiconductor memory to which the present embodiments can be applied will be briefly described.

The semiconductor memory may have a cross-point structure in which memory cells are located at intersections between lower lines extending in a direction and upper lines extending in another direction crossing the lower lines. In this structure, the memory cell may store different data according to voltage or current applied to the lower line and the upper line. As an example, the memory cell may be a variable resistance element that stores different data by switching between different resistance states according to voltage or current applied to the lower line and the upper line.

Hereinafter, embodiments including the semiconductor memory having the cross-point structure will be described.

Figure 9A:
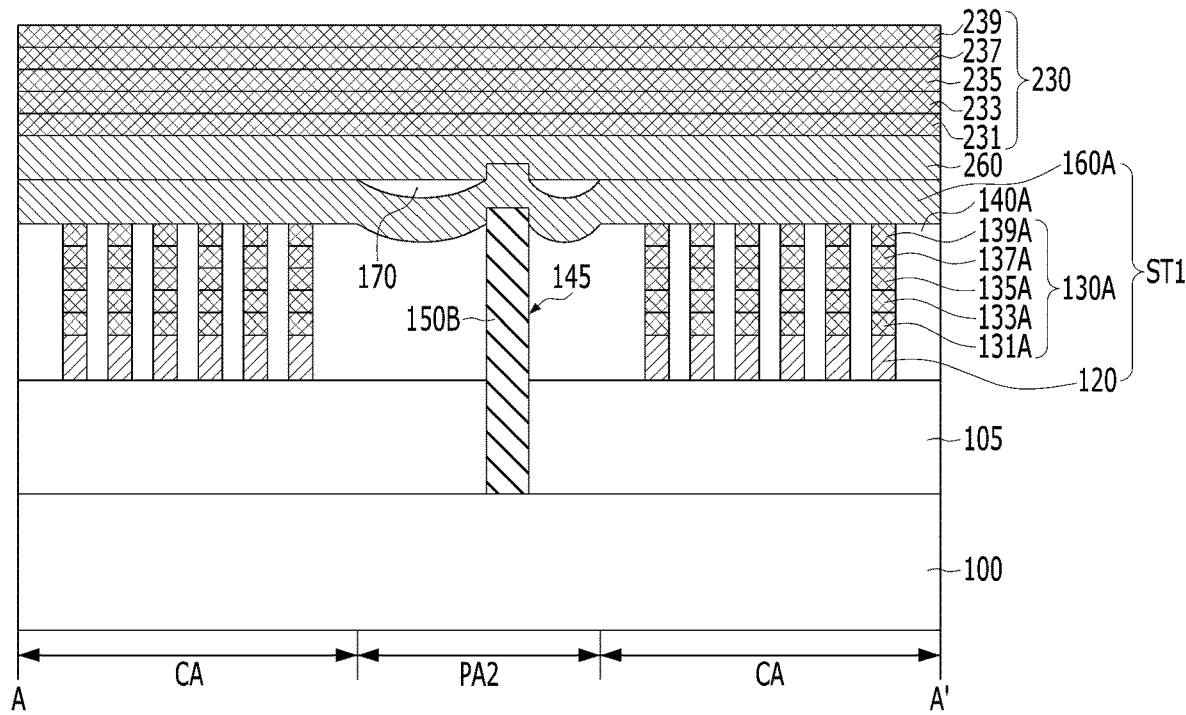
Figure 9B:
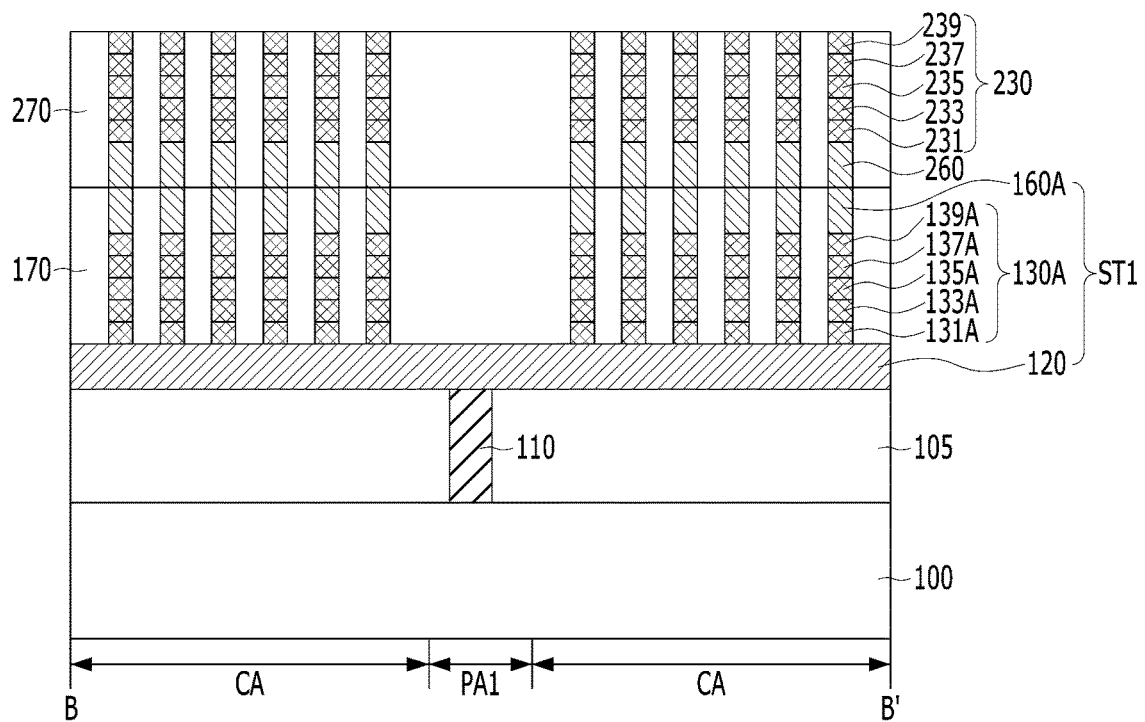
Figure 10A:
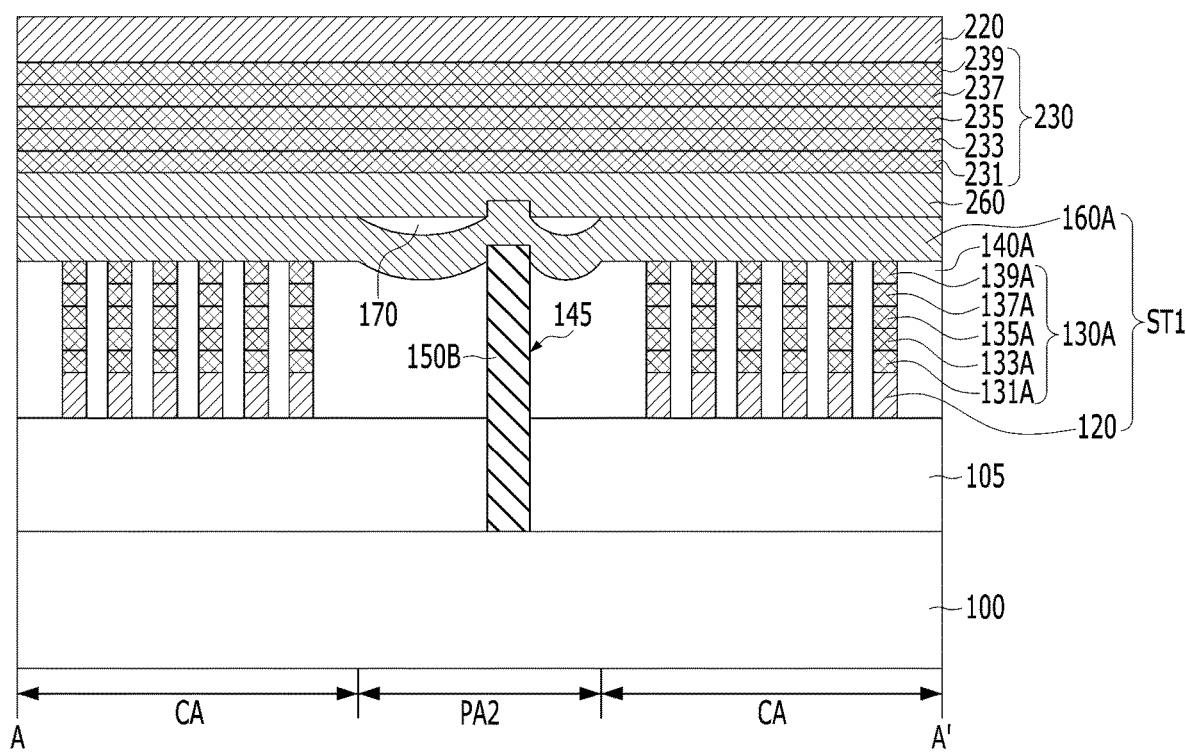
Figure 10B:
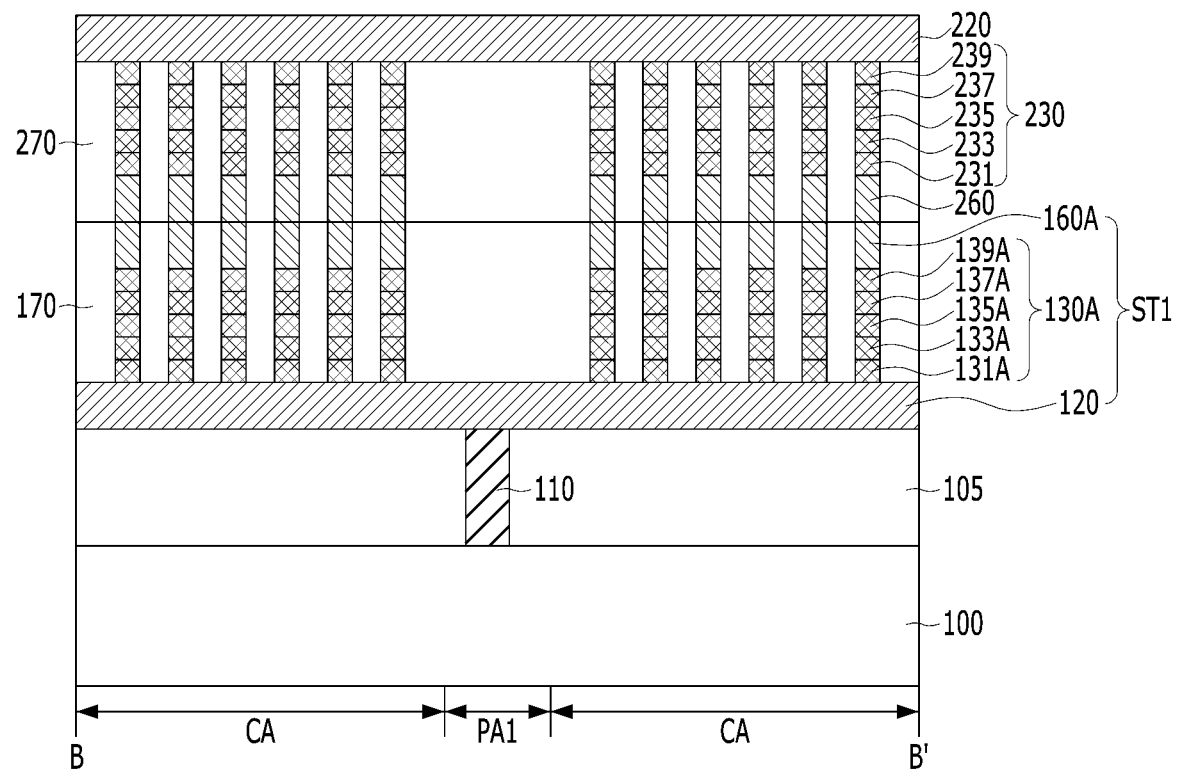
Figure 11A:
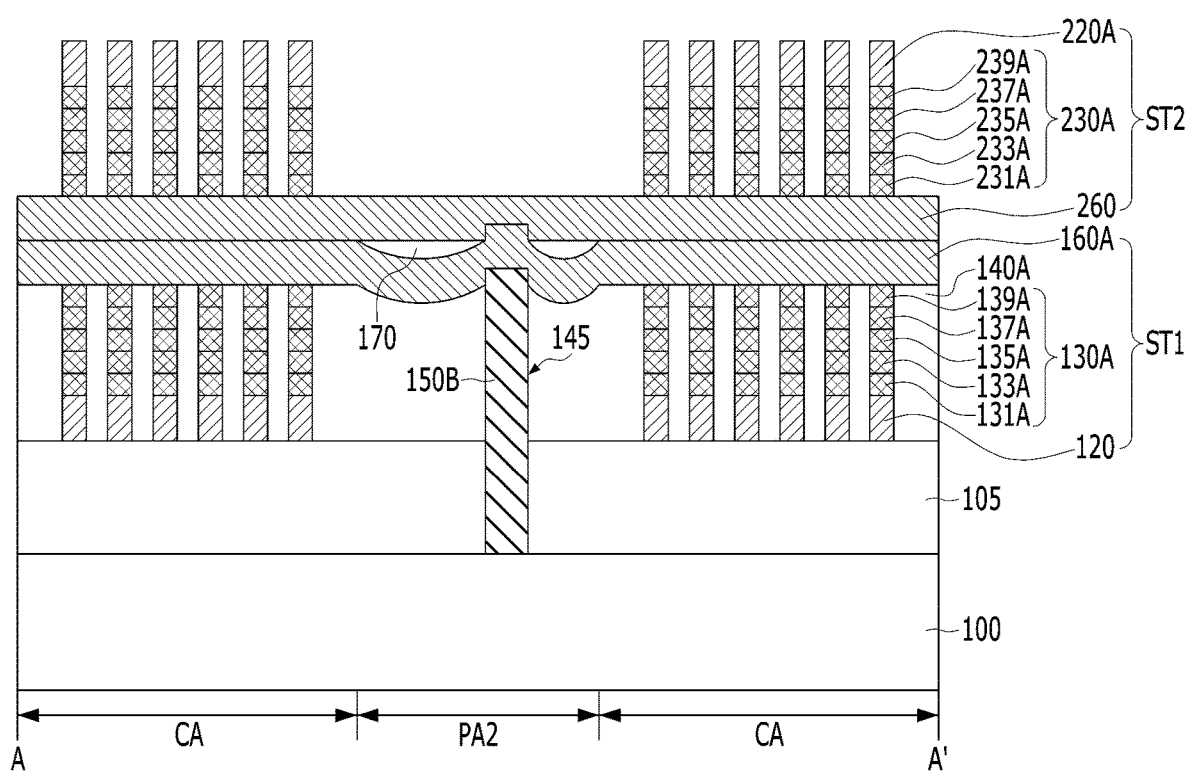
Figure 11B:
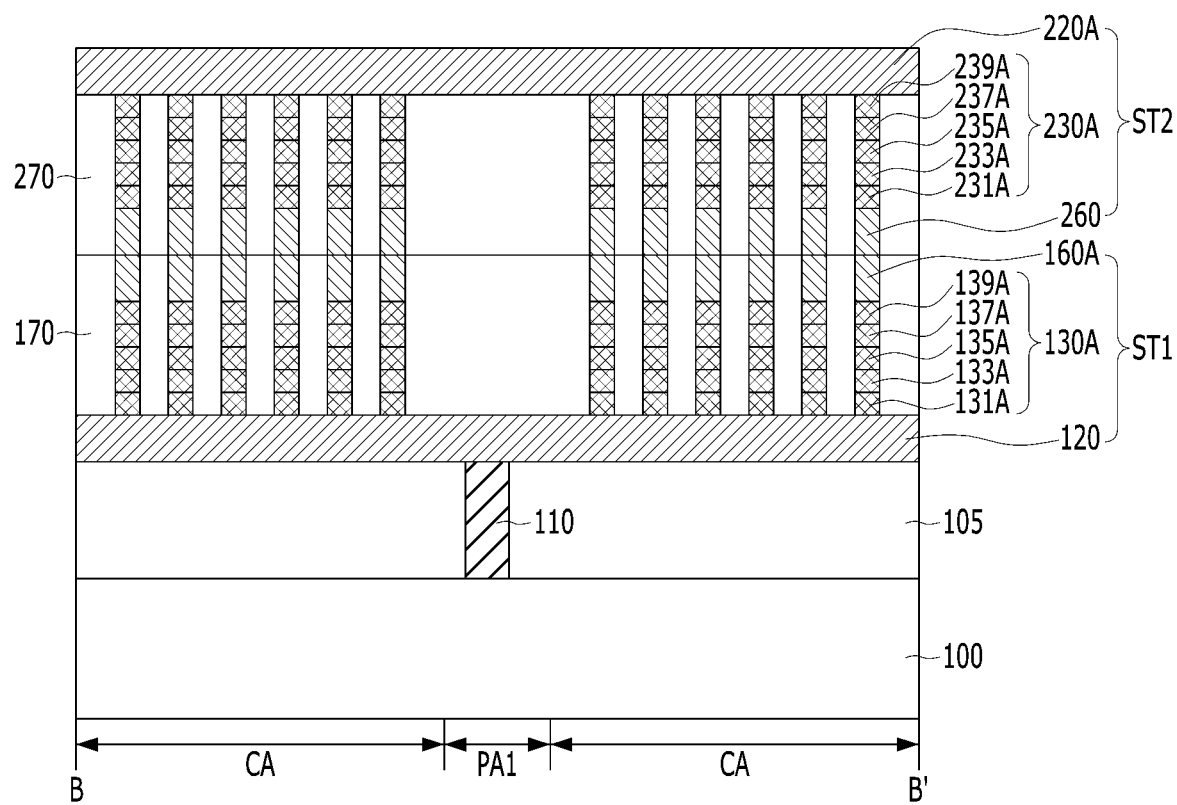
Figure 12:
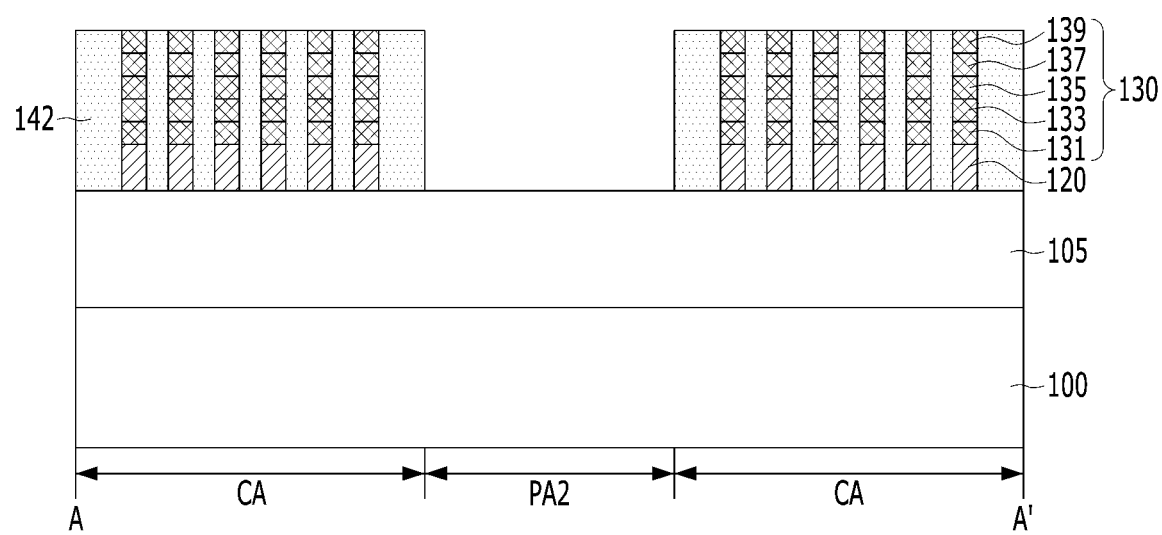
FIGS. 12 to 15 are views illustrating a semiconductor memory according to another embodiment of the present disclosure, and a method for fabricating the same.

FIGS. 1 to 11B are views illustrating a semiconductor memory according to an embodiment of the present disclosure, and a method for fabricating the same. FIG. 1 is a plan view illustrating a semiconductor memory according to an embodiment of the present disclosure, FIG. 11A is a cross-sectional view taken along a line A-A' of FIG. 1, and FIG. 11B is a cross-sectional view taken along a line B-B' of FIG. 1. FIGS. 2A to 10B are cross-sectional views illustrating intermediate processes for fabricating the semiconductor memory of FIGS. 1, 11A, and 11B. FIGS. 2A, 3A, 4A, 5A, 6A, 7A, 8A, 9A, and 10A are shown based on a cross-section taken along the line A-A' of FIG. 1. FIGS. 2B, 3B, 4B, 5B, 6B, 7B, 8B, 9B, and 10B are shown based on a cross-section taken along the line B-B' of FIG. 1.

First, a fabricating method will be described.

Figure 2A:
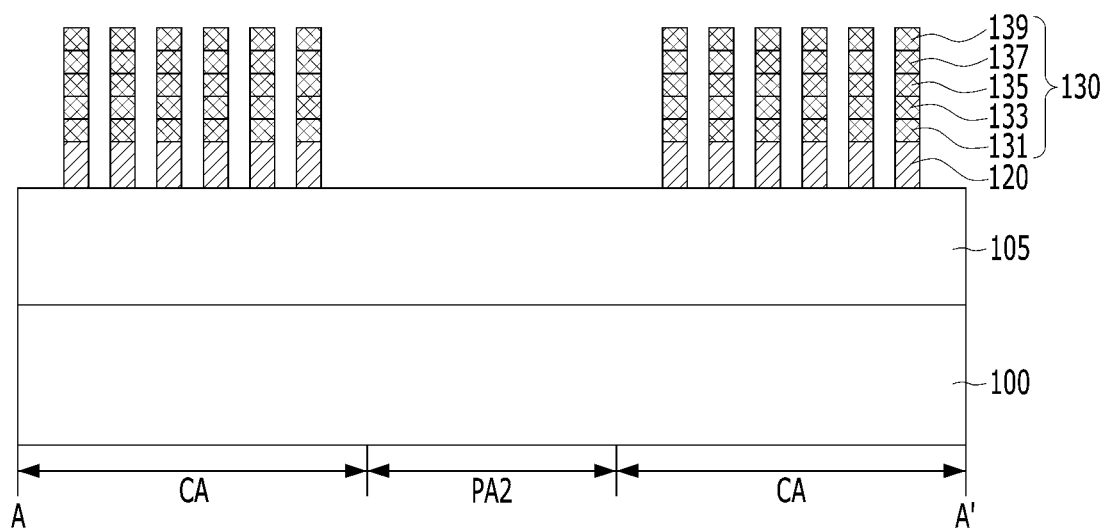
Figure 2B:
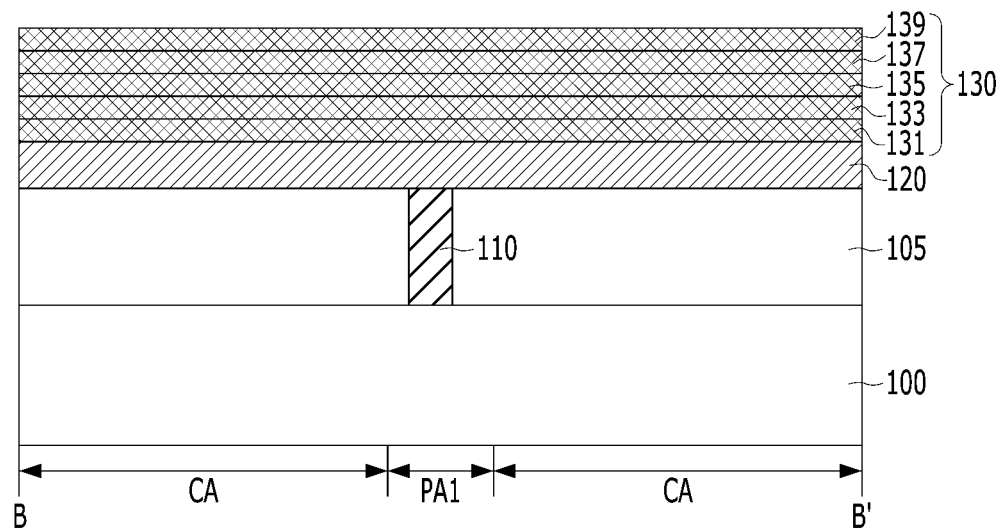

Referring to FIGS. 1, 2A and 2B, a substrate 100 may be provided. The substrate 100 may include a semiconductor material such as silicon. In the substrate 100, a predetermined lower structure (not shown) may be formed. For example, an integrated circuit for driving lines (see 120, 220A, 160A, and 260 in FIG. 1), which will be described later, may be formed in the substrate 100.

A cell region CA and peripheral circuit regions PA1 and PA2 may be defined in the substrate 100. The cell region CA may be a region in which a plurality of memory cells are arranged, and the peripheral circuit regions PA1 and PA2 may be regions in which various components constituting peripheral circuits are disposed. In the present embodiment, four cell regions CA may be arranged to be spaced apart from each other in a 2*2 array along a first direction and a second direction. The peripheral circuit regions PA1 and PA2 may be located between these cell regions CA. For convenience of description, a region between two cell regions CA arranged in the first direction may be referred to as a first peripheral circuit region PA1, and a region between two cell regions CA arranged in the second direction may be referred to as a second peripheral circuit region PA2. In the present embodiment, an area of the second peripheral circuit region PA2 may be greater than an area of the first peripheral circuit region PA1. However, the present disclosure is not limited thereto, and the number, the arrangement or the areas of the cell regions CA and the peripheral circuit regions PA1 and PA2 may be variously modified.

Subsequently, a first interlayer insulating layer 105 may be formed over the substrate 100. The first interlayer insulating layer 105 may include various insulating materials such as silicon oxide, silicon nitride, or a combination thereof.

Subsequently, a first contact plug 110 may be formed in the first interlayer insulating layer 105. The first contact plug 110 may penetrate the first interlayer insulating layer 105, and may be connected to a portion of the substrate 100. The first contact plug 110 may be disposed in the first peripheral circuit region PA1. A lower end of the first contact plug 110 may be connected to one end of a circuit (not shown), which is formed in the substrate 100 and serves to supply a voltage or current to a first line 120 to be described later. An upper end of the first contact plug 110 may be connected to the first line 120. In the present embodiment, a plurality of first contact plugs 110 may be connected to a plurality of first lines 120 in a one-to-one correspondence. The first contact plugs 110 may be arranged in a zigzag form along the second direction in order to provide a gap between adjacent first contact plugs 110 in the second direction. However, the present disclosure is not limited to this embodiment, and the number or the arrangement of the first contact plugs 110 may be variously modified. The first contact plug 110 may be formed by selectively etching the first interlayer insulating layer 105 to form a contact hole exposing a portion of the substrate 100, and filling the contact hole with a conductive material. The first contact plug 110 may be formed of various conductive materials, for example, a metal such as platinum (Pt), tungsten (W), aluminum (Al), copper (Cu)

and tantalum (Ta), a metal nitride such as titanium nitride (TiN) and tantalum nitride (TaN), or a combination thereof.

Subsequently, the first lines 120 and initial first memory cells 130 may be formed over the first interlayer insulating layer 105 in which the first contact plug 110 is formed. The first lines 120 and the initial first memory cells 130 may be formed by depositing a conductive layer for forming the first lines 120 and a material layer for forming the initial first memory cells 130, and etching the conductive layer and the material layer by using a mask pattern (not shown), which has a line shape extending in the first direction, as an etching barrier. Accordingly, in a plan view, the first lines 120 and the initial first memory cells 130 may have a line shape extending in the first direction, and may cross the two cell regions CA arranged in the first direction and the first peripheral circuit region PA1 between them.

The first line 120 may be connected to a corresponding first contact plug 110. The first line 120 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof.

The line-shaped initial first memory cell 130 may be patterned in a subsequent process to be transformed into an island-shaped first memory cell (see 130A in FIG. 1). The initial first memory cell 130 may have a multi-layered structure. As an example, the initial first memory cell 130 may have a stacked structure of a lower electrode layer 131, a selection element layer 133, an intermediate electrode layer 135, a variable resistance layer 137, and an upper electrode layer 139.

The lower electrode layer 131 and the upper electrode layer 139 may be positioned at a lower end and an upper end of the initial first memory cell 100, respectively, and may function to apply a voltage or current required for operations of the first memory cell 130A. The intermediate electrode layer 135 may physically separate the selection element layer 133 and the variable resistance layer 137, but electrically connect them. The lower electrode layer 131, the intermediate electrode layer 135 or the upper electrode layer 139 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof. Alternatively, the lower electrode layer 131, the intermediate electrode layer 135 or the upper electrode layer 139 may be a carbon electrode.

The selection element layer 133 may prevent a current leakage between the first memory cells 130A, which share the first lines 120 or second lines (see 160A in FIG. 1) to be described later. To this end, the selection element layer 133 may have a threshold switching characteristic for blocking or substantially limiting a current when a magnitude of an applied voltage is less than a predetermined threshold value and for allowing a current to abruptly increase above the threshold value. The threshold value may be referred to as a threshold voltage, and selection element layer 133 may be implemented in a turn-on state or a turn-off state based on the threshold voltage. The selection element layer 133 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The variable resistance layer 137 may be a portion that functions to store data in the first memory cell 130A. To this end, the variable resistance layer 137 may have a variable resistance characteristic that switches between different resistance states depending on an applied voltage or current. The variable resistance layer 137 may have a single-layered structure or a multi-layered structure including at least one of materials used for an RRAM, a PRAM, an MRAM, an FRAM, or the like, that is, a metal oxide such as a perovskite-based oxide, a transition metal oxide, or the like, a phase change material such as a chalcogenide-based material, a ferromagnetic material, a ferroelectric material, or the like.

However, the layered structure of the initial first memory cell 130 is not limited to these examples. When the initial first memory cell 130 is a variable resistance element and includes the variable resistance layer 137 essential for data storage, the stacking order of the stacked layers may be changed or at least one of the stacked layers may be omitted. As an example, one or more layers of the lower electrode layer 131, the selection element layer 133, the intermediate electrode layer 135, and the upper electrode layer 139 may be omitted. Alternatively, the positions of the selection element layer 133 and the variable resistance layer 137 may be reversed. Alternatively, one or more layers (not shown) may be added to the initial first memory cell 130 to improve the properties or processes of the first memory cell 130A.

Figure 3A:
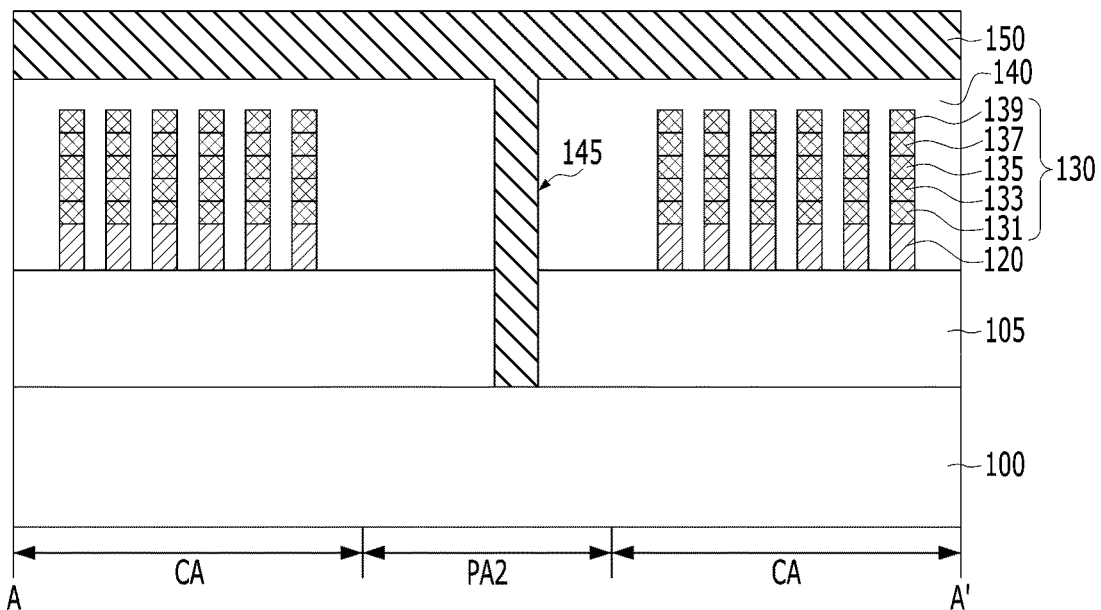
Figure 3B:
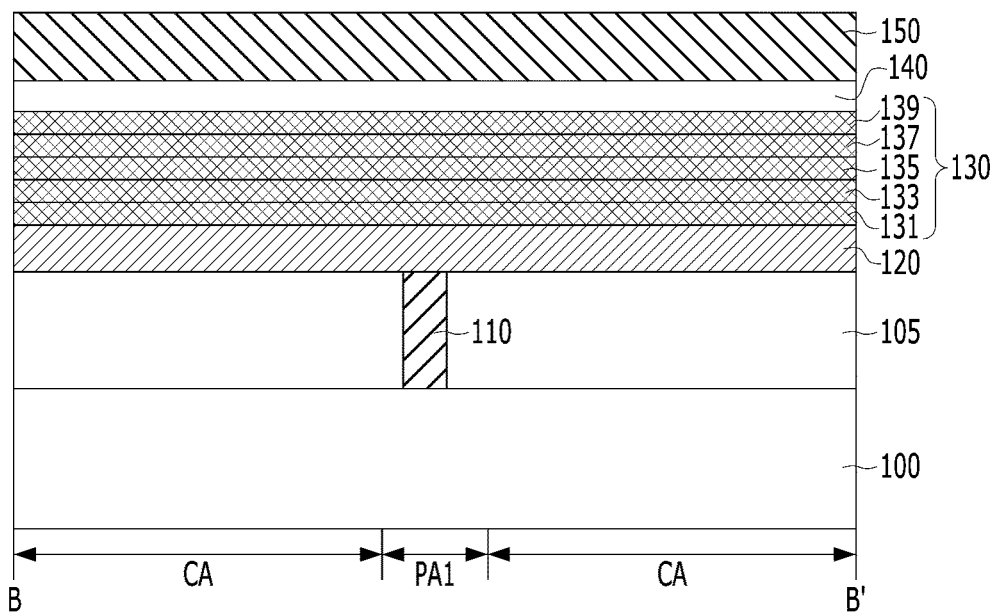

Referring to FIGS. 1, 3A, and 3B, a second interlayer insulating layer 140 may be formed over the structure of FIGS. 2A and 2B. The second interlayer insulating layer 140 may cover the first lines 120 and the initial first memory cells 130. The second interlayer insulating layer 140 may include various insulating materials such as silicon oxide, silicon nitride, or a combination thereof. An upper surface of the second interlayer insulating layer 140 may be positioned above an upper surface of the initial first memory cell 130, and may be a substantially flat surface. To this end, the second interlayer insulating layer 140 having a target thickness and/or a target upper surface height may be formed by depositing an insulating material with a thickness greater than the thickness of the second interlayer insulating layer 140 over the structure of FIGS. 2A and 2B, and performing a planarization process on the insulating material. The planarization process may include a polishing process such as a chemical mechanical polishing (CMP) or an etch-back process.

Subsequently, a contact hole 145 passing through the second interlayer insulating layer 140 and the first interlayer insulating layer 105 may be formed to expose a portion of the substrate 100. The contact hole 145 may be disposed in the second peripheral circuit region PA2. The contact hole 145 may provide a space in which the second contact plug (see 150B in FIG. 1) is to be formed. The contact hole 145 may be formed by forming a mask pattern (not shown), which exposes a region where the contact hole 145 is to be formed, over the second interlayer insulating layer 140, and then etching the second interlayer insulating layer 140 and the first interlayer insulating layer 105 using the mask pattern as an etching barrier. However, in another embodiment, a contact plug (not shown) may be pre-formed in the same position as the contact hole 145 in the first interlayer insulating layer 105. This contact plug may be formed together with the first contact plug 110 in the process of forming the first contact plug 110. In this case, the contact hole 145 may be formed to penetrate the second interlayer insulating layer 140 to expose the contact plug in the first interlayer insulating layer 105.

Subsequently, a conductive layer 150 filling the contact hole 145 may be formed. The conductive layer 150 may be formed to have a sufficient thickness to fill the contact hole 145. Therefore, the conductive layer 150 may be present over the second interlayer insulating layer 140 in a predetermined thickness. The conductive layer 150 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof.

Figure 4A:
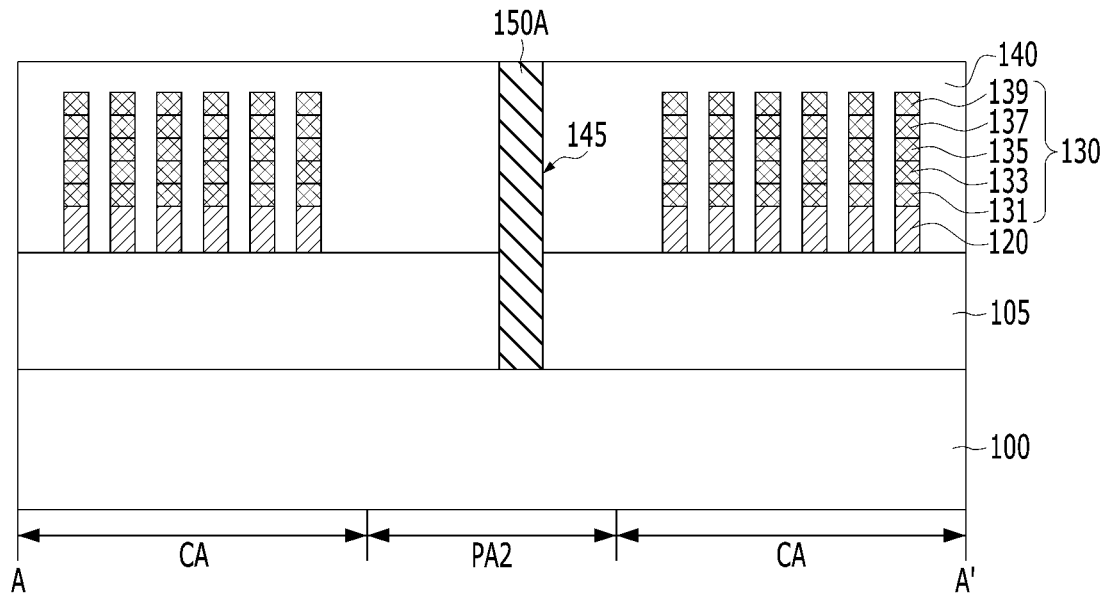
Figure 4B:
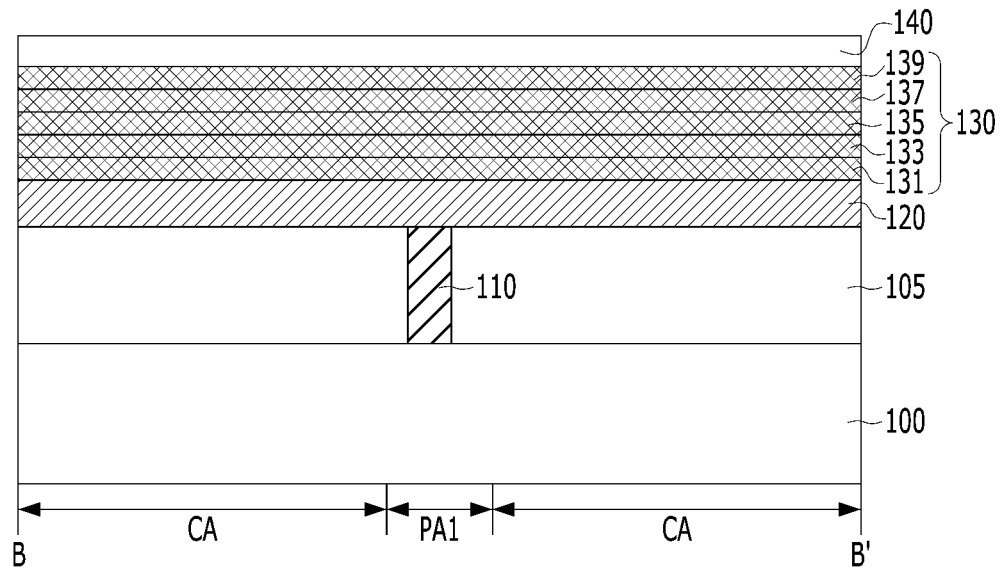

Referring to FIGS. 1, 4A, and 4B, a planarization process may be performed on the conductive layer 150 to expose the upper surface of the second interlayer insulating layer 140. As a result, the conductive layer 150 may be located in the contact hole 145. In an embodiment, the conductive layer 150 remains only in the contact hole 145. The conductive layer 150 in the contact hole 145 will be referred to as an initial second contact plug 150A. At this time, a height of an upper surface of the initial second contact plug 150A may depend on the amount of time for which the planarization process is performed. That is, as the time of the planarization process on the conductive layer 150 increases, a degree of removal of the conductive layer 150 may increase, and thus, the upper surface of the initial second contact plug 150A may be lowered. However, as will be described later, in the present embodiment, a height of an upper surface of a second contact plug 150B is equal to or higher than the height of the upper surface of the initial first memory cell 130. Accordingly, in consideration of this constraint, the planarization process time for the conductive layer 150 may be adjusted such that the height of the upper surface of the initial second contact plug 150A is higher than the height of the upper surface of the initial first memory cell 130. As an example, if the planarization process is stopped at a time when the upper surface of the second interlayer insulating layer 140 is exposed, the upper surface of the initial second contact plug 150A may be positioned at the same height as the upper surface of the second interlayer insulating layer 140 while being positioned higher than the upper surface of the initial first memory cell 130.

Figure 5A:
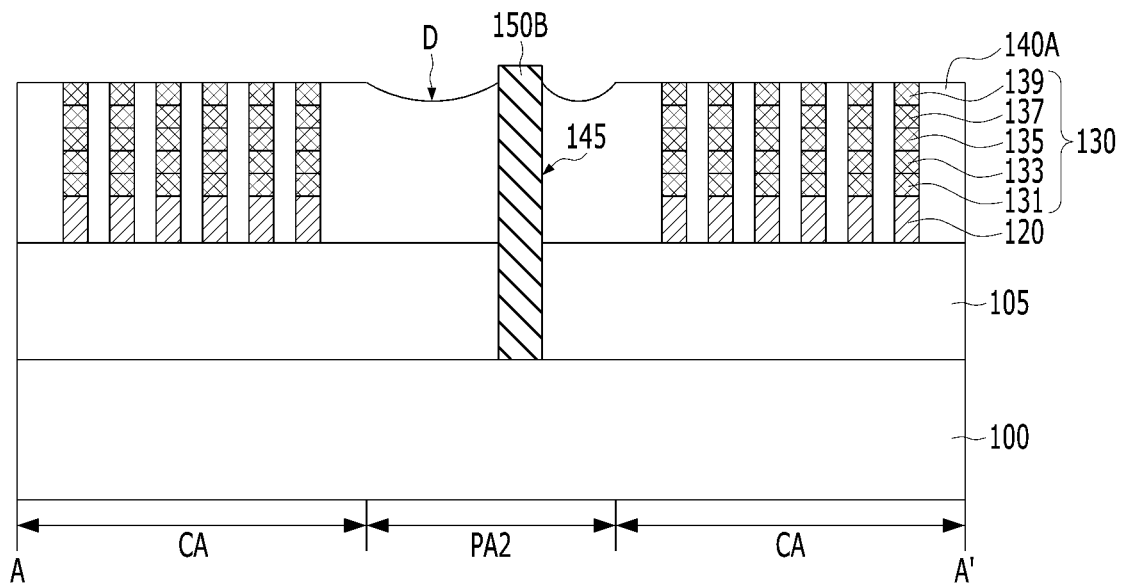
Figure 5B:
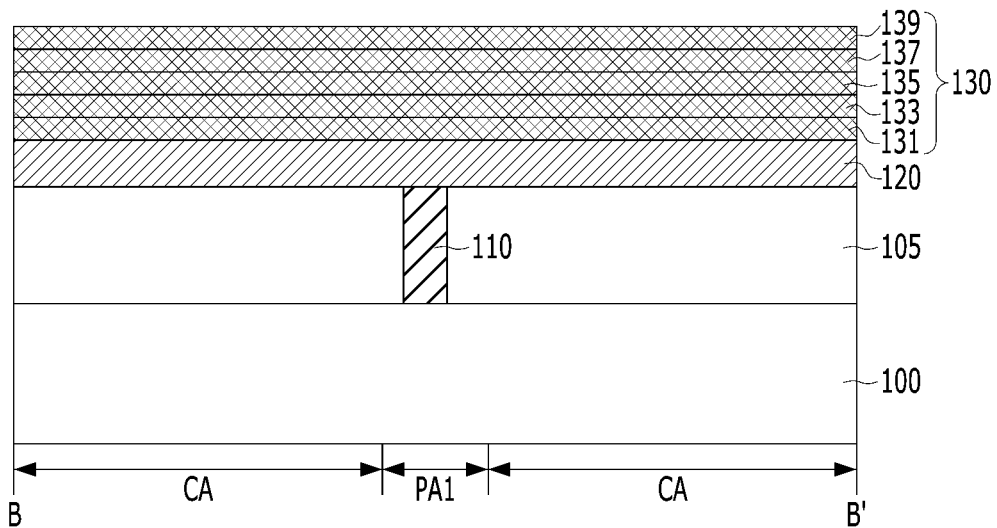

Referring to FIGS. 1, 5A, and 5B, a planarization process may be performed on the second interlayer insulating layer 140 so that the upper surface of the initial first memory cell 130 is exposed. The second interlayer insulating layer 140 on which the planarization process has been performed will be referred to as a second interlayer insulating layer pattern 140A.

However, in the cell region CA, the stacked structures of the first lines 120 and the initial first memory cells 130 may be densely arranged, and thus, the pattern density may be high. On the other hand, in the second peripheral circuit region PA2, the initial second contact plugs 150A may be present, and thus, the pattern density may be low. Due to the difference in pattern density, the degree of removal of the second interlayer insulating layer 140 in the second peripheral circuit region PA2 may be greater than that in the cell region CA during the planarization process for the second interlayer insulating layer 140. Accordingly, the height of the upper surface of the second interlayer insulating layer pattern 140A in the cell region CA may be the same as or similar to the height of the upper surface of the initial first memory cell 130. On the other hand, the upper surface of the second interlayer insulating layer pattern 140A in the second peripheral circuit region PA2 may be recessed. That is, a dishing phenomenon may occur in the second peripheral circuit region PA2. A portion in which the upper surface of the second interlayer insulating layer pattern 140A in the second peripheral circuit region PA2 is recessed will be referred to as a recessed portion D. The degree to which the second interlayer insulating layer pattern 140A is recessed may increase as a distance from the cell region CA and the second contact plug 150B increases. In an embodiment, the degree to which the second interlayer insulating layer pattern 140A is recessed increases as a distance from the cell region CA increases over a first distance and decreases over a second distance, as the recessed portion D gets closer to the second contact plug 150B. Accordingly, as shown in FIG. 5A, edges of the recessed portion D, which are adjacent to the cell region CA and the second contact plug 150B, may be higher than a center of the recessed portion D.

Meanwhile, the initial second contact plug 150A in a state in which the planarization process for the second interlayer insulating layer 140 has been performed will be referred to as a second contact plug 150B. Since the planarization process for the second interlayer insulating layer 140 is performed using a gas, liquid, or a combination thereof having a high polishing rate or etch rate for the second interlayer insulating layer 140, the initial second contact plug 150A may not be affected, or may only be minimally affected by the planarization process. Accordingly, a height of an upper surface of the second contact plug 150B may be substantially the same as the height of the upper surface of the initial second contact plug 150A, or may be slightly lower than the height of the upper surface of the initial second contact plug 150A. Although the height of the upper surface of the second contact plug 150B is lower than the height of the upper surface of the initial second contact plug 150A, it may be equal to or higher than the height of the upper surface of the initial first memory cell 130.

As a result, the second contact plug 150B in the second peripheral circuit region PA2 may have a shape protruding above the recessed portion D of the second interlayer insulating layer pattern 140A. Furthermore, the height of the upper surface of the second contact plug 150B may be equal to or higher than the height of the upper surface of the initial first memory cell 130.

A lower end of the second contact plug 150B may be connected to one end of a circuit (not shown), which is formed in the substrate 100 and serves to supply a voltage or current to a second line (see 160A in FIG. 1). An upper end of the second contact plug 150B may be connected to the second line 160A. In the present embodiment, a plurality of second contact plugs 150B may be connected to the second lines 160A in a one-to-one correspondence. The second contact plugs 150B may be arranged in a zigzag form along the first direction. This is to provide a gap between adjacent second contact plugs 150B in the first direction. However, the present disclosure is not limited thereto, and the number or the arrangement of the second contact plugs 150B may be variously modified.

Figure 6A:
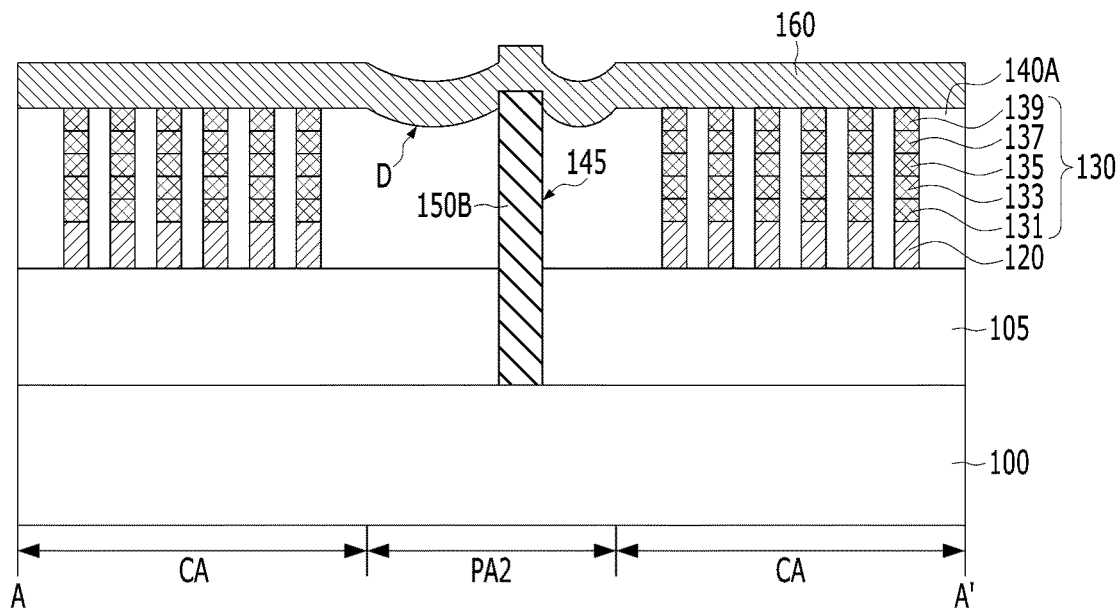
Figure 6B:
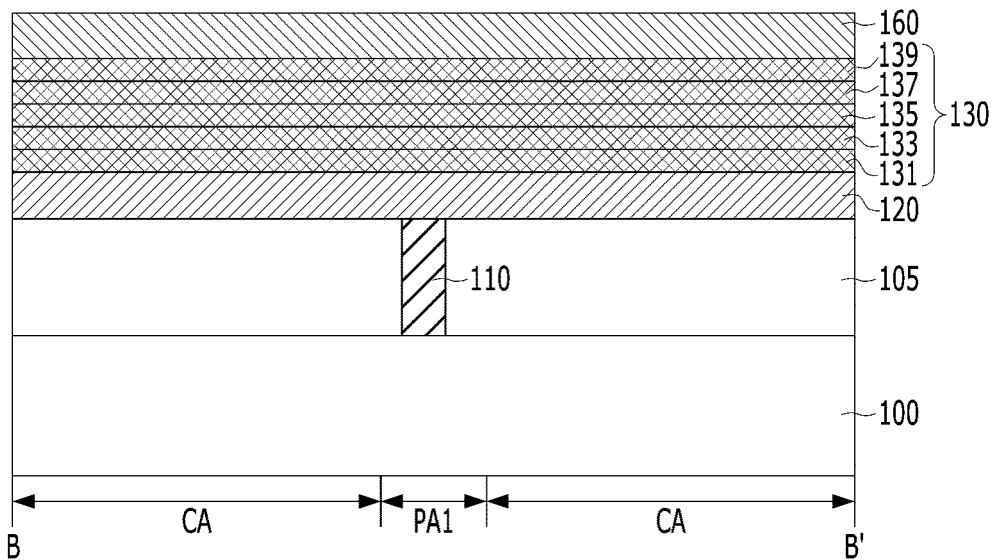

Referring to FIGS. 1, 6A and 6B, a conductive layer 160 for forming the second lines 160A may be formed over the structure of FIGS. 5A and 5B.

The conductive layer 160 may be formed along a profile of a structure located under the conductive layer 160. That is, the conductive layer 160 may be formed along the upper surface of the second interlayer insulating layer pattern 140A, the upper surface of the initial first memory cell 130, and the upper surface of the second contact plug 150B. Further, the conductive layer 160 may be formed to have a substantially constant thickness. As a result, the conductive layer 160 may have substantially flat upper and lower surfaces in the cell region CA. On the other hand, in the second peripheral circuit region PA2, upper and lower surfaces of the conductive layer 160 may be recessed over the recessed portion D, and may protrude over the second contact plug 150B. The conductive layer 160 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof.

Figure 7A:
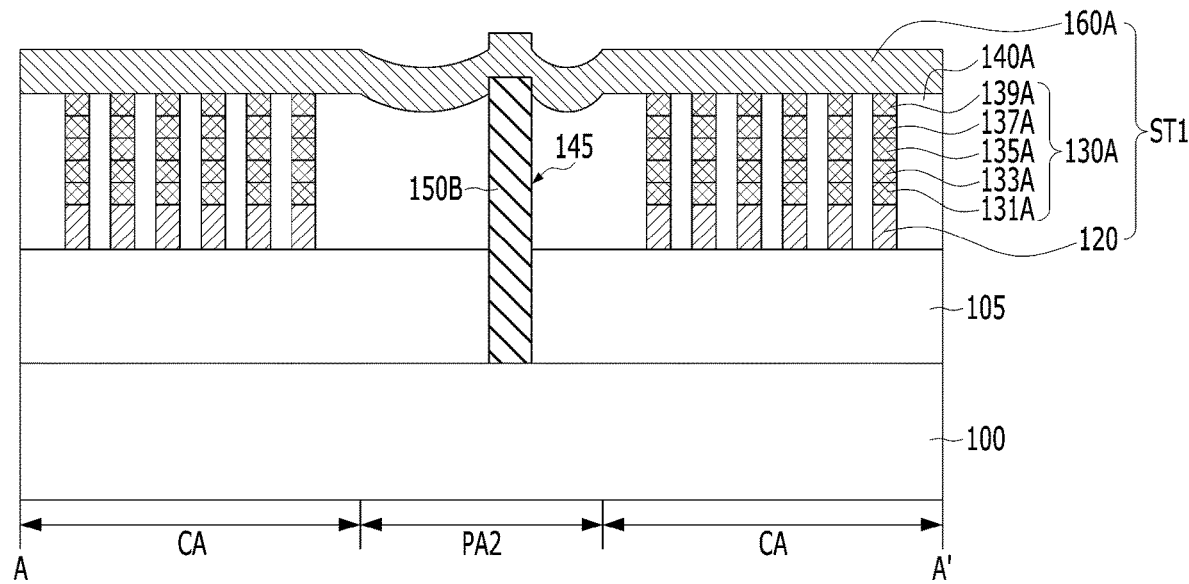
Figure 7B:
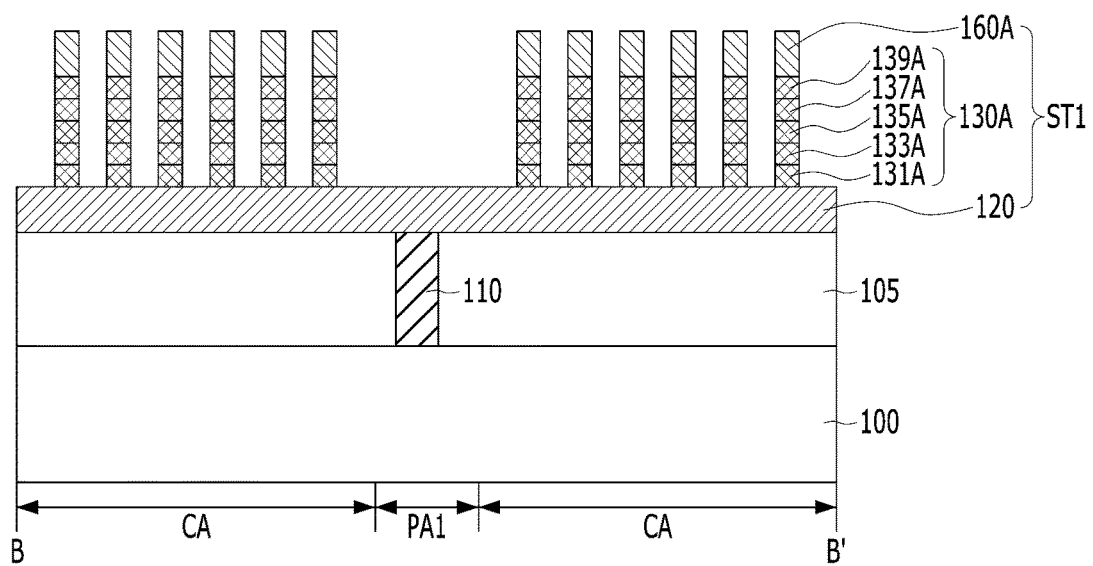

Referring to FIGS. 1, 7A, and 7B, the conductive layer 160 and the initial first memory cells 130 may be etched by using a mask pattern (not shown), which has a line shape extending in the second direction, as an etching barrier, and thus, the second lines 160A and the first memory cells 130A may be formed.

The second lines 160A may have a line shape extending in the second direction in a plan view, and may cross the two cell regions CA arranged in the second direction and the second peripheral circuit region PA2 between them. The second line 160A may be connected to a corresponding second contact plug 150B. Since the conductive layer 160 is formed along the lower profile, upper and lower surfaces of the second line 160A in the cell region CA may be substantially flat, while upper and lower surfaces of the second line 160A in the second peripheral circuit region PA2 are recessed over the recessed portion D and protrude over the second contact plug 150B.

The first memory cells 130A may have an island shape in a plan view while being located at each intersection of the first lines 120 and the second lines 160A. Since the first lines 120 and the second lines 160A only intersect in the cell region CA, the first memory cells 130A may be arranged in a matrix form along the first direction and the second direction only in the cell region CA. Both sidewalls of the first memory cell 130A in the first direction may be aligned with both sidewalls of the second line 160A, and both sidewalls of the first memory cell 130A in the second direction may be aligned with both sidewalls of the first line 120. The first memory cell 130A may include a stacked structure of a lower electrode 131A, a selection element 133A, an intermediate electrode 135A, a variable resistance element 137A, and an upper electrode 139A.

As a result, a first stack ST1 having a cross-point structure in which the first memory cells 130A are located at intersections between the first lines 120 and the second lines 160A may be formed.

Figure 8A:
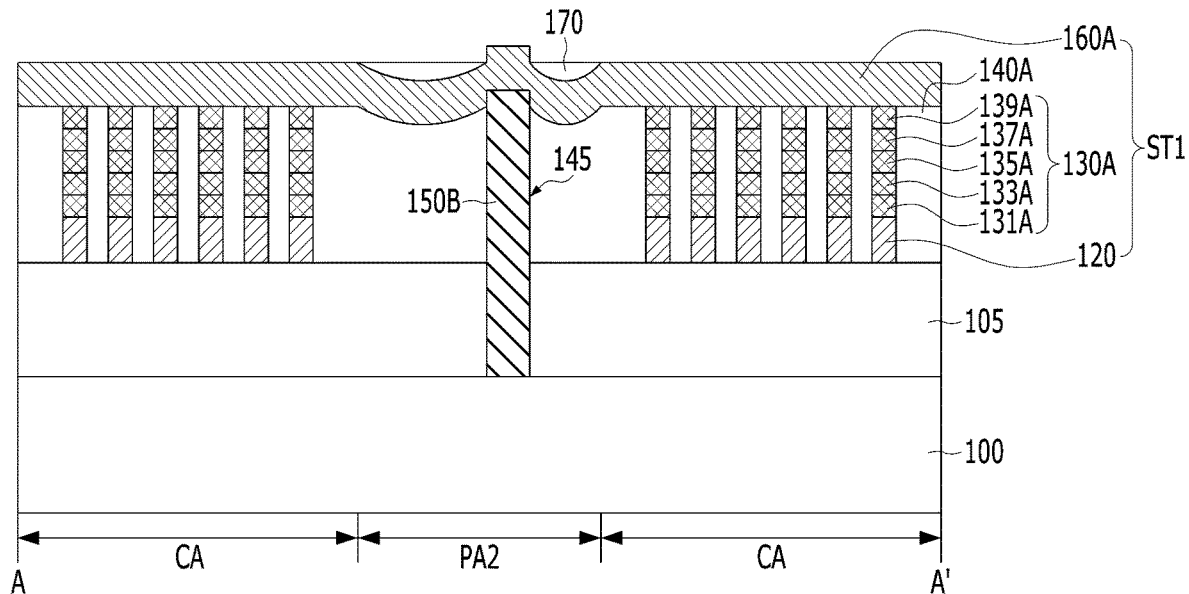
Figure 8B:
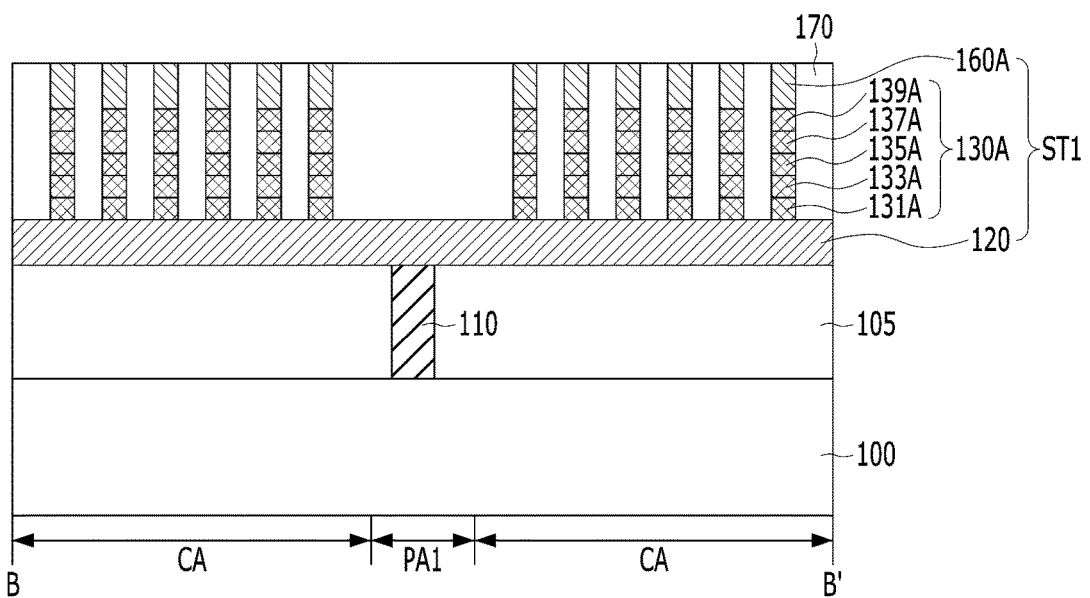

Referring to FIGS. 1, 8A, and 8B, a third interlayer insulating layer 170 filling spaces between the second lines 160A and between the first memory cells 130A may be formed. The third interlayer insulating layer 170 may be formed by forming an insulating material with a thickness sufficient to fill the spaces between the second lines 160A and between the first memory cells 130A, and then, performing a planarization process until the upper surfaces of the second lines 160A are exposed. The third interlayer insulating layer 170 may include various insulating materials such as silicon oxide, silicon nitride, or a combination thereof.

At this time, the upper surface of the second line 160A may be substantially flat in the cell region CA, but may have irregularities in the second peripheral circuit region PA2. Specifically, in the second peripheral circuit region PA2, the upper surface of the second line 160A may be recessed over the recessed portion D to have a height lower than the height of the upper surface of the second line 160A in the cell region CA. In addition, in the second peripheral circuit region PA2, the upper surface of the second line 160A may protrude over the second contact plug 150B to have a height higher than the height of the upper surface of the second line 160A in the cell region CA. Since the upper surface of the third interlayer insulating layer 170 is positioned at the same height as the upper surface of the second line 160A in the cell region CA, the third interlayer insulating layer 170 may be embedded in a recessed portion formed in the second line 160A in the second peripheral circuit region PA2. In addition, the upper surface of the third interlayer insulating layer 170 may have a height equal to or lower than the upper surface of the second contact plug 150B.

As a result, the structure of FIGS. 8A and 8B may provide a substantially flat upper surface in the cell region CA and the second peripheral circuit region PA2, except for a portion located over the second contact plug 150B. Furthermore, in another embodiment, when the height of the upper surface of the second contact plug 150B is substantially the same as the height of the initial first memory cell 130, the structure of FIGS. 8A and 8B may provide a substantially flat upper surface throughout the cell region CA and the second peripheral circuit region PA2.

Referring to FIGS. 1, 9A and 9B, third lines 260 and initial second memory cells 230 may be formed over the structure of FIGS. 8A and 8B. In a plan view, the third lines 260 and the initial second memory cells 230 may have a line shape extending in the second direction, and may cross the two cell regions CA arranged in the second direction and the second peripheral circuit region PA2 between them. Furthermore, in a plan view, the third lines 260 and the initial second memory cells 230 may overlap with and correspond to the second lines 160A in a one-to-one correspondence.

In the cell region CA, a lower surface of the third line 260 may contact the upper surface of the second line 160A. In addition, in the second peripheral circuit region PA2, a portion of a lower surface of the third line 260, which is positioned over the second contact plug 150B, may contact the upper surface of the second line 160A. On the other hand, the remainder of the lower surface of the third line 260 in the second peripheral circuit region PA2, that is, a portion of the third line 260 located over the recessed portion D, may be spaced apart from the upper surface of the second line 160A. This is because the third interlayer insulating layer 170 is interposed between the portion of second line 160A having a recessed upper surface over the recessed portion D and the third line 260. The lower surface of the third line 260 may have the same profile as the upper surface provided by the structure of FIGS. 8A and 8B. That is, the lower surface of the third line 260 may be substantially flat in the cell region CA and the second peripheral circuit region PA2, except for a portion positioned over the second contact plug 150B. Alternatively, the lower surface of the third line 260 may be substantially flat in the cell region CA and the second peripheral circuit region PA2.

An upper surface of the third line 260 may be substantially flat, which facilitates subsequent processes. When the lower surface of the third line 260 is flat, the third line 260 may have a substantially flat upper surface by having a substantially uniform thickness. However, when the lower surface of the third line 260 is not flat, a planarization process may be additionally performed to make the third line 260 have a flat upper surface, which will be described in more detail in the following process.

The third line 260 and the initial second memory cell 230 as described above, may be formed by depositing a conductive layer for forming the third line 260 and a material layer for forming the initial second memory cell 230, and then, etching the conductive layer and the material layer using a mask pattern (not shown), which has a line shape extending in the second direction, as an etching barrier. The third line 260 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof. When depositing the conductive layer for forming the third line 260, the conductive layer may be formed along a lower profile to have an uneven upper surface. In other words, when a lower profile has an irregular shape, that shape is reflected on the upper surface of a layer formed over the lower profile. In this case, after depositing the conductive layer for forming the third line 260, and before depositing the material layer for forming the initial second memory cell 230, a planarization process may be additionally performed on the conductive layer.

Since the third line 260 overlaps and contacts the second line 160A, the second line 160A and the third line 260 may function as a single line. That is, the second line 160A and the third line 260 may function to transfer a voltage or current to one end of the first memory cell 130A of the first stack ST1 and to one end of a second memory cell of a second stack (see 230A and ST2 in FIGS. 11A and 11B) to be described later. That is, the second line 160A and the third line 260 may function as a common line of the first and second stacks ST1 and ST2.

The line-shaped initial second memory cell 230 may be patterned in a subsequent process to be transformed into an island-shaped second memory cell (see 230A in FIG. 1). The initial second memory cell 230 may have a multi-layered structure. As an example, the initial second memory cell 230 may have a structure substantially the same as the initial first memory cell 130. That is, in the initial second memory cell 230, the lower electrode layer 231, the selection element layer 233, the intermediate electrode layer 235, the variable resistance layer 237, and the upper electrode layer 239 may be sequentially stacked from bottom to top. However, the present disclosure is not limited to this embodiment. In another embodiment, the initial second memory cell 230 may have a structure symmetrical to the initial first memory cell 130 with the second line 160A and the third line 260 therebetween. That is, in the initial second memory cell 230, the lower electrode layer 231, the selection element layer 233, the intermediate electrode layer 235, the variable resistance layer 237, and the upper electrode layer 239 may be sequentially stacked from top to bottom.

Subsequently, a fourth interlayer insulating layer 270 filled between the third lines 260 and between the initial second memory cells 230 may be formed. The fourth interlayer insulating layer 270 may be formed by depositing an insulating material with a thickness sufficient to fill the spaces between the third lines 160 and between the initial second memory cells 130, and then, performing a planarization process to expose the upper surfaces of the initial second memory cells 230.

Referring to FIGS. 1, 10A and 10B, a conductive layer 220 for forming fourth lines may be formed over the structure of FIGS. 9A and 9B. The conductive layer 220 may include various conductive materials, for example, a metal such as platinum (Pt), tungsten (W), aluminum (Al), copper (Cu) and tantalum (Ta), a metal nitride such as titanium nitride (TiN) and tantalum nitride (TaN), or a combination thereof.

Referring to FIGS. 1, 11A, and 11B, fourth lines 220A and second memory cells 230A may be formed by etching the conductive layer 220 and the initial second memory cells 230 using a mask pattern (not shown), which has a line shape extending in the first direction, as an etching barrier.

The fourth lines 220A may have a line shape extending in the first direction, and cross the two cell regions CA arranged in the first direction and the first peripheral circuit region PA1 therebetween in a plan view. The fourth lines 220A may overlap the first lines 120, respectively, in a plan view.

The second memory cell 230A may have an island shape, and may be positioned at each of intersections of the third lines 260 and the fourth lines 220A, in a plan view. Also, the second memory cells 230A may overlap the first memory cells 130A, respectively, in a plan view. Accordingly, the second memory cells 230A may be arranged in a matrix form along the first direction and the second direction only in the cell region CA. Both sidewalls of the second memory cell 230A in the first direction may be aligned with both sidewalls of the third line 260, and both sidewalls of the second memory cell 230A in the second direction may be aligned with both sidewalls of the fourth line 220A. The second memory cell 230A may include a stacked structure of a lower electrode 231A, a selection element 233A, an intermediate electrode 235A, a variable resistance element 237A, and an upper electrode 239A.

Accordingly, a second stack ST2 having a cross-point structure in which the second memory cells 230A are located at intersections of the third lines 260 and the fourth lines 220A may be formed.

The semiconductor memory of the present embodiment may be fabricated by the above-described processes.

Referring back to FIGS. 1, 11A, and 11B, the semiconductor memory of the present embodiment may include the substrate 100 including the cell region CA, the first peripheral circuit region PA1, and the second peripheral circuit region PA2, the first lines 120 disposed over the substrate 100 and extending in the first direction across the cell region CA and the first peripheral circuit region PA1, the second lines 160A disposed over the first lines 120 to be spaced apart from the first lines 120 and extending in the second direction across the cell region CA and the second peripheral circuit region PA2, the first memory cells 130A positioned at the intersections between the first lines 120 and the second lines 160A in the cell region CA where the first lines 120 and the second lines 160A intersect with each other, the third lines 260 disposed over the second lines 160A and respectively overlapping the second lines 160A, the fourth lines 220A disposed over the third lines 260 to be spaced apart from the third lines 260 and respectively overlapping the first lines 120, and the second memory cells 230A positioned at the intersections between the third lines 260 and the fourth lines 220A in the cell region CA where the third lines 260 and the fourth lines 220A intersect with each other. The first line 120 may be connected to a portion of the substrate 100 through the first contact plug 110 which is disposed in the first peripheral circuit region PA1 and is connected to the first line 120 under the first line 120. In addition, the second line 160A may be connected to a portion of the substrate 100 through the second contact plug 150B which is disposed in the second peripheral circuit region PA2 and is connected to the second line 160A under the second line 160A.

The second line 160A may be formed along the lower profile. That is, the second line 160A may contact the upper surfaces of the first memory cells 130A and the second interlayer insulating layer pattern 140A in the cell region CA, and may contact the upper surfaces of the second interlayer insulating layer pattern 140A and the second contact plug 150B in the second peripheral circuit region PA2. Here, under the second line 160A, the upper surfaces of the first memory cells 130A and the second interlayer insulating layer pattern 140A in the cell region CA may be substantially flat, while the upper surface of the second interlayer insulating layer pattern 140A in the second peripheral circuit region PA2 may have the recessed portion D, which is lower than the flat portion. The upper surface of the second contact plug 150B may have a height equal to or higher than the height of the upper surfaces of the second interlayer insulating layer pattern 140A and the first memory cells 130A in the cell region CA. Accordingly, the lower surface and/or the upper surface of the second line 160A may be substantially flat in the cell region CA, while the upper surface of the second line 160A may be recessed over the second interlayer insulating layer pattern 140A in the second peripheral circuit region PA2, and may protrude over the second contact plug 150B in the second peripheral circuit region PA2.

Portions of the third line 260 positioned over the cell region CA and the second contact plug 150B may contact the upper surface of the second line 160A. On the other hand, the rest of the third line 260, that is, a portion positioned over the second interlayer insulating layer pattern 140A in the second peripheral circuit region PA2 between the second contact plug 150B and the cell region CA may be spaced apart from the upper surface of the second line 160A. The third interlayer insulating layer 170 may be buried in the space between the third line 260 and the second line 160A to prevent the third line 260 from being lowered. In the present embodiment, the entire part of the third line 260 between the second contact plug 150B and the cell region CA may be spaced apart from the second line 160A. However, in another embodiment, only part of the third line 260 between the second contact plug 150B and the cell region CA may be spaced apart from the second line 160A.

The second line 160A and the third line 260 may be a common line of the first stack ST1 and the second stack ST2. For example, when the first line 120 and the fourth line 220A function as a word line, the second line 160A and third line 260 may function as a common bit line. Conversely, when the first line 120 and the fourth line 220A function as a bit line, the second line 160A and third line 260 may function as a common word line.

The semiconductor memory described above, and its fabricating method may have the following advantages.

First, the dishing phenomenon in the second peripheral circuit region PA2 may occur due to the difference in pattern density between the cell region CA and the second peripheral circuit region PA2. If the second line 160A and the third line 260 are formed in this state, the second line 160A and the third line 260 may be spaced apart from each other in the second peripheral circuit region PA2. However, in the present embodiment, by increasing the height of the second contact plug 150B, parts of the second line 160A and the third line 260 disposed over the second contact plug 150B of the second peripheral circuit region PA2 may contact one another. In this case, since sheet resistances of the second line 160A and the third line 260 are decreased, and current delivery through the second line 160A and the third line 260 is smooth, operating characteristics of the semiconductor memory may be improved.

In addition, by using the method of increasing the height of the second contact plug 150B as described above, contact between the second line 160A and the third line 260 in the second peripheral circuit region PA2 may be facilitated. If an additional polishing process for the second line 160A is performed to provide contact between the second line 160A and the third line 260 in the second peripheral circuit region PA2, the process time/cost may be increased and the height of the second line 160A may be lowered, which may cause an increase in resistances of the second line 160A and the third line 260.

In summary, by the semiconductor memory and its fabricating method according to the present embodiment, it may be possible to improve the operating characteristics of the semiconductor memory and simplify the fabricating process of the semiconductor memory.

FIGS. 12 to 15 are views illustrating a semiconductor memory according to another embodiment of the present disclosure, and a method for fabricating the same. FIGS. 12 to 15 are shown based on a cross-section taken along the line A-A' of FIG. 1. Hereinafter, the description will focus on differences from the above-described embodiment. In addition, components that are substantially the same as the above-described embodiment are denoted by the same reference numerals.

First, the process of FIGS. 2A and 2B may be performed. As a result, the first interlayer insulating layer 105 may be formed over the substrate 100, and the structures in which the first lines 120 and the initial first memory cells 130 are stacked may be formed over the first interlayer insulating layer 105.

Subsequently, a cell insulating layer 142 filled between the stacked structures of the first lines 120 and the initial first memory cells 130 may be formed in the cell region CA. The cell insulating layer 142 may be formed of a material having a low thermal conductivity, that is, a low-K material. When heat is generated or used during operation of the first memory cell 130A, for example, when the variable resistance layer 137 includes a phase change material, the cell insulating layer 142 may prevent the heat from being lost or transferred to the adjacent first memory cell 130A. When the heat loss increases, more heat during the operation of the first memory cell 130A may be required to provide a phase change. In addition, when the heat transferred to the adjacent first memory cell 130A increases, data stored in the adjacent first memory cell 130A, that is, a phase of the adjacent first memory cell 130A, may be changed unintentionally. Therefore, the low-K material may be used as the cell insulating layer 142. The thermal conductivity of the cell insulating layer 142 may be lower than a thermal conductivity of the first interlayer insulating layer 105 or a peripheral circuit insulating layer (see 144 of FIG. 13) to be described later. As an example, the cell insulating layer 142 may have a thermal conductivity lower than that of silicon oxide. Further, as an example, the cell insulating layer 142 may include an insulating material including silicon and carbon, for example, SiOC, SiOCH, SiOCHN, SiC, SiCON or SiCN. This insulating material may be a flowable material to be cured in a subsequent process.

The cell insulating layer 142 may be formed by following processes. First, an insulating material may be formed over the first interlayer insulating layer 105 to a thickness sufficient to cover the stacked structures of the first lines 120 and the initial first memory cells 130, and then a planarization process such as a chemical mechanical polishing (CMP) process may be performed. In the present embodiment, the planarization process may be performed to expose the upper surfaces of the initial first memory cells 130. Subsequently, the insulating material of the first and second peripheral circuit regions PA1 and PA2 may be removed using a mask (not shown) that covers the cell region CA and opens the first and second peripheral circuit regions PA1 and PA2. As a result, the cell insulating layer 142 filled between the first lines 120 and between the initial first memory cells 130 may be formed only in the cell region CA.

The above process of removing the cell insulating layers 142 of the first and second peripheral circuit regions PA1 and PA2 may be performed because the low-K material used as the cell insulating layer 142 is easily lost due to its high hygroscopicity, and a high degree of shrinkage during curing causes stress. Therefore, the cell insulating layer 142 may exist only in the cell region CA useful for improving the operating characteristics, and may be removed in other regions.

Figure 13:
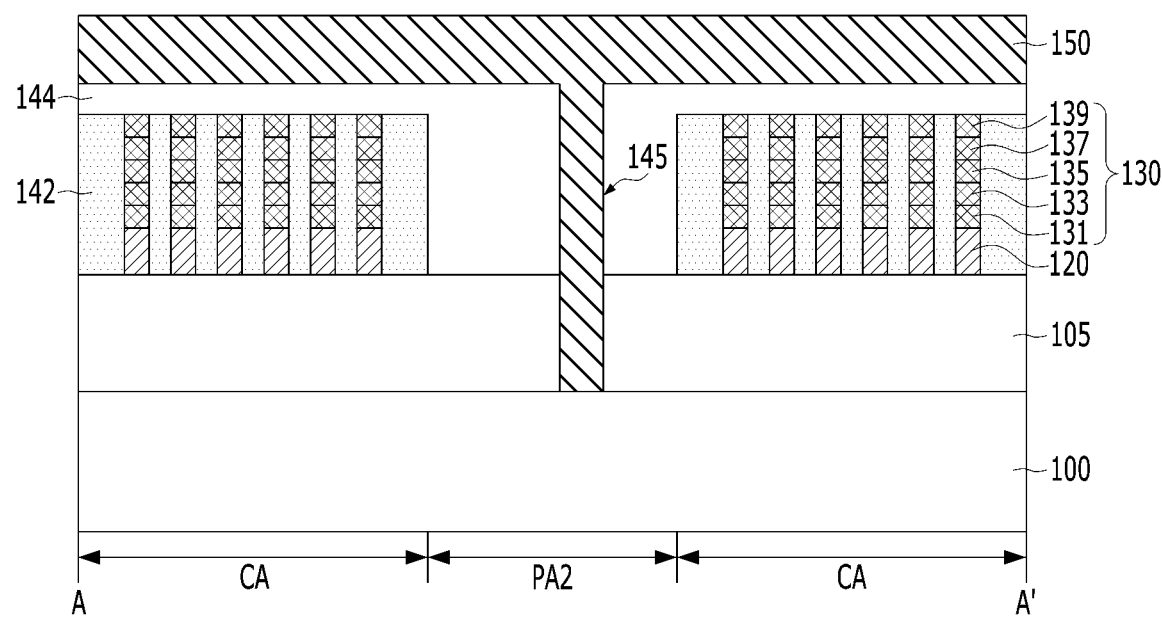

Referring to FIG. 13, a peripheral circuit insulating layer 144 may be formed to a thickness sufficient to fill the first and second peripheral circuit regions PA1 and PA2. The peripheral circuit insulating layer 144 may be formed to have a thickness that covers the cell insulating layer 142. The peripheral circuit insulating layer 144 may include various insulating materials such as silicon oxide, silicon nitride, or a combination thereof. In particular, the peripheral circuit insulating layer 144 may be formed of an insulating material having a higher thermal conductivity than the cell insulating layer 142.

Subsequently, in the second peripheral circuit region PA2, the contact hole 145 that penetrates the peripheral circuit insulating layer 144 and the first interlayer insulating layer 105 may be formed to expose a portion of the substrate 100, and then, the conductive layer 150 having a thickness sufficient to fill the contact hole 145 may be formed.

Figure 14:
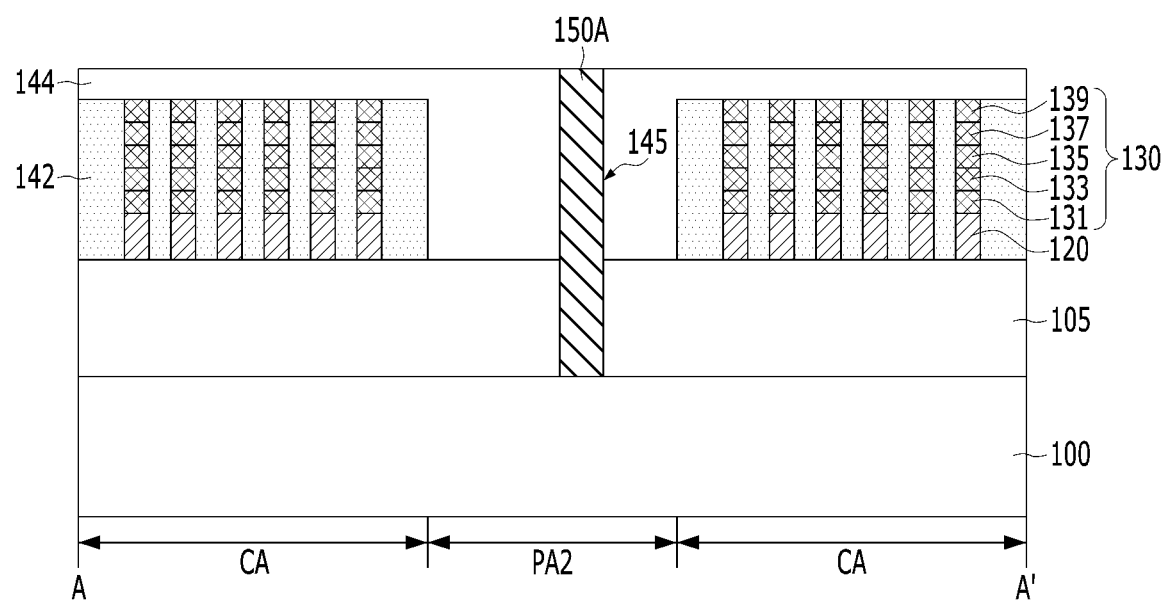

Referring to FIG. 14, the initial second contact plug 150A buried in the contact hole 145 may be formed by performing a planarization process on the conductive layer 150 so that an upper surface of the peripheral circuit insulating layer 144 is exposed.

Figure 15:
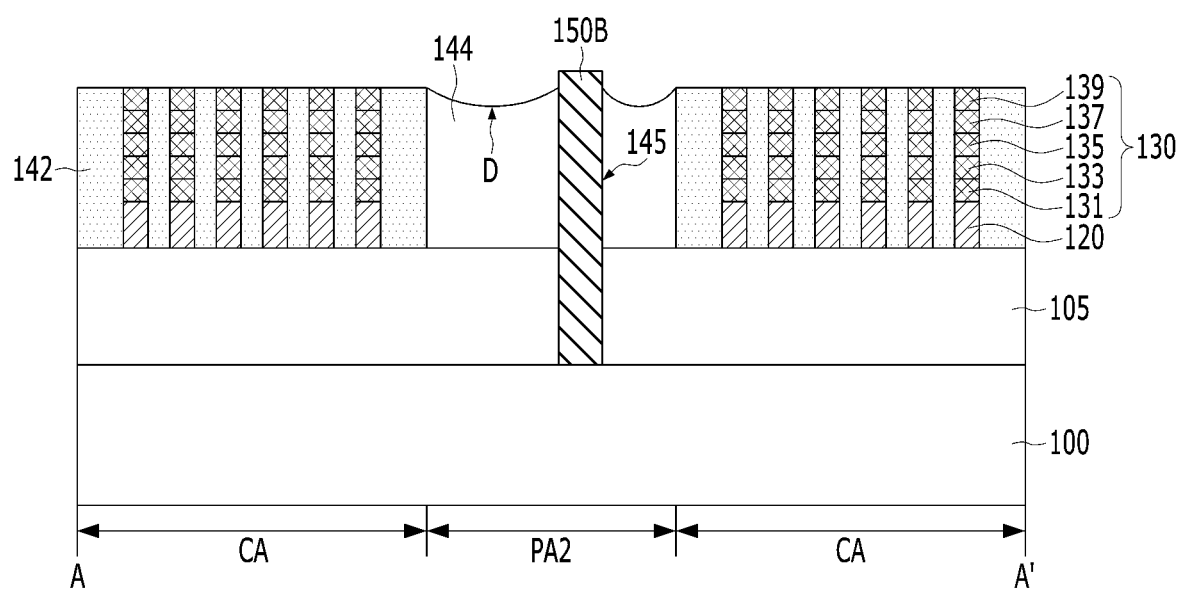

Referring to FIG. 15, a planarization process may be performed on the peripheral circuit insulating layer 144. This planarization process may be performed such that the upper surfaces of the initial first memory cells 130 are exposed. As a result, the peripheral circuit insulating layer 144 may be removed from the cell region CA, and may remain only in the first and second peripheral circuit regions PA1 and PA2.

In the cell region CA, an upper surface of the cell insulating layer 142 may be located at a height equal to or similar to the height of the upper surfaces of the initial first memory cells 130. On the other hand, in the second peripheral circuit region PA2, the upper surface of the peripheral circuit insulating layer 144 may be recessed to form a recessed portion D. When the planarization process for the peripheral circuit insulating layer 144 is performed, the second contact plug 150B, which has an upper surface located at the same height as the upper surface of the initial second contact plug 150A or a height slightly lower than the upper surface of the initial second contact plug 150A, may be obtained.

Since the subsequent processes may be substantially the same as the above-described embodiment, detailed description thereof will be omitted. Although not illustrated, a material having a low thermal conductivity substantially the same as the cell insulating layer 142 may be formed in the cell region CA of the second stack (see ST2 in FIGS. 11A and 11B).

The above and other memory circuits or semiconductor devices based on the disclosed technology can be used in a range of devices or systems. FIGS. 16-19 provide some examples of devices or systems that can implement the memory circuits disclosed herein.

Figure 16:
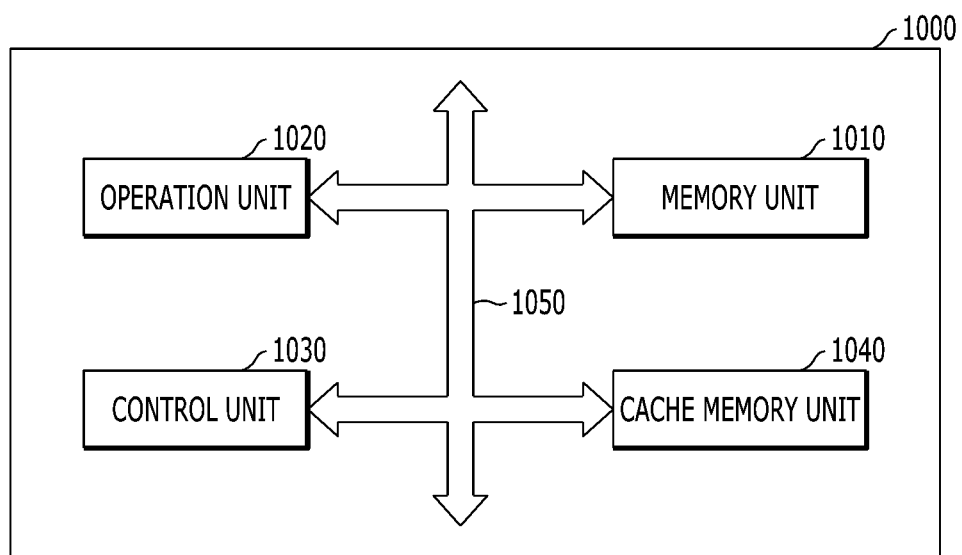
FIG. 16 is an example of a configuration diagram of a microprocessor implementing memory circuitry based on the disclosed technology.

FIG. 16 is an example of configuration diagram of a microprocessor implementing memory circuitry based on the disclosed technology.

Referring to FIG. 16, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a contact plug disposed in the second peripheral circuit region and having an upper surface coupled to the second line; a plurality of third lines disposed over the second lines and respectively overlapping the second lines; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein a first portion of the third line located in the cell region and a second portion of the third line located over the contact plug contact the second line, and at least a part of a remainder of the third line is spaced apart from the second line. Through this, in the memory unit 1010, operating characteristics and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 17:
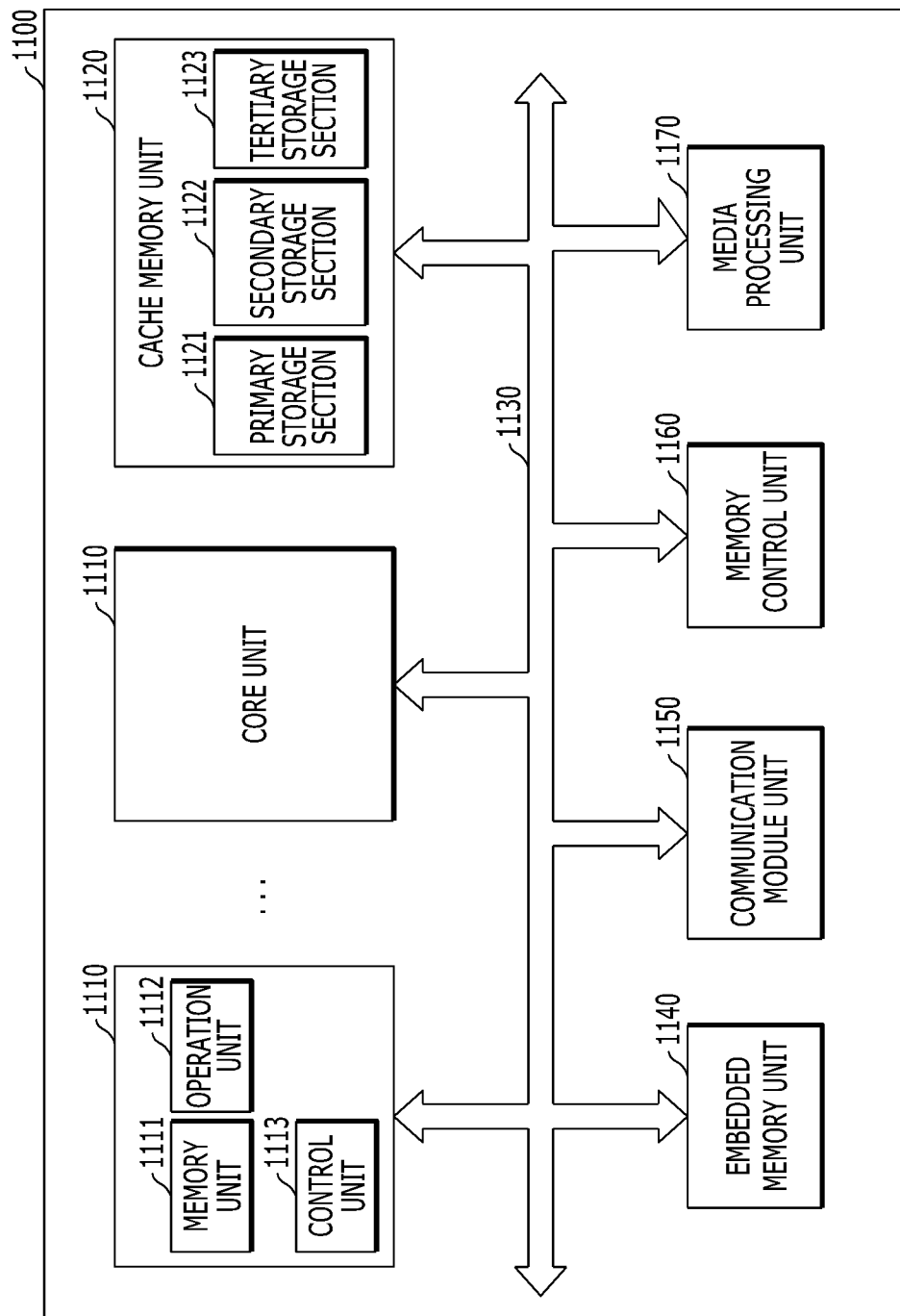
FIG. 17 is an example of a configuration diagram of a processor implementing memory circuitry based on the disclosed technology.

FIG. 17 is an example of configuration diagram of a processor implementing memory circuitry based on the disclosed technology.

Referring to FIG. 17, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a contact plug disposed in the second peripheral circuit region and having an upper surface coupled to the second line; a plurality of third lines disposed over the second lines and respectively overlapping the second lines; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein a first portion of the third line located in the cell region and a second portion of the third line located over the contact plug contact the second line, and at least a part of a remainder of the third line is spaced apart from the second line. Through this, operating characteristics and fabricating processes may be improved in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 18:
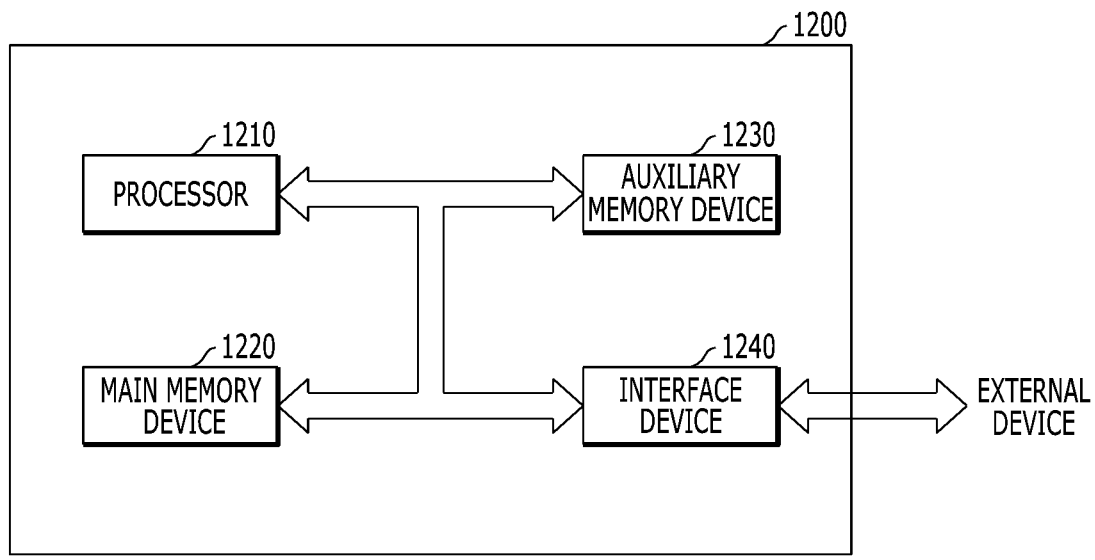
FIG. 18 is an example of a configuration diagram of a system implementing memory circuitry based on the disclosed technology.

FIG. 18 is an example of configuration diagram of a system implementing memory circuitry based on the disclosed technology.

Referring to FIG. 18, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands, process operation, comparison, etc. for the data stored in the system 1200, and control these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a contact plug disposed in the second peripheral circuit region and having an upper surface coupled to the second line; a plurality of third lines disposed over the second lines and respectively overlapping the second lines; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein a first portion of the third line located in the cell region and a second portion of the third line located over the contact plug contact the second line, and at least a part of a remainder of the third line is spaced apart from the second line. Through this, operating characteristics and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 19) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 19:
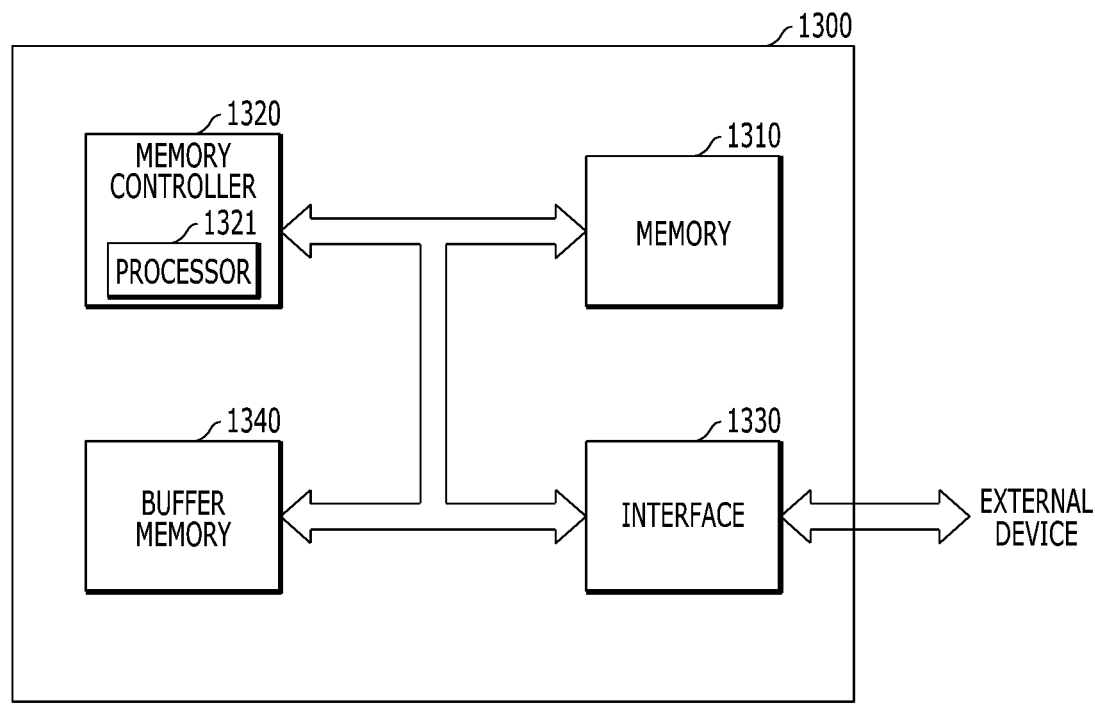
FIG. 19 is an example of a configuration diagram of a memory system implementing memory circuitry based on the disclosed technology.

FIG. 19 is an example of configuration diagram of a memory system implementing memory circuitry based on the disclosed technology.

Referring to FIG. 19, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a substrate including a cell region, a first peripheral circuit region disposed at a first side of the cell region in a first direction, and a second peripheral circuit region disposed at a second side of the cell region in a second direction crossing the first direction; a plurality of first lines disposed over the substrate and extending in the first direction across the cell region and the first peripheral circuit region; a plurality of second lines disposed over the first lines and extending in the second direction across the cell region and the second peripheral circuit region; a contact plug disposed in the second peripheral circuit region and having an upper surface coupled to the second line; a plurality of third lines disposed over the second lines and respectively overlapping the second lines; a plurality of fourth lines disposed over the third lines and respectively overlapping the first lines; a plurality of first memory cells disposed in the cell region and located at intersections of the first lines and the second lines between the first lines and the second lines; and a plurality of second memory cells disposed in the cell region and located at intersections of the third lines and the fourth lines between the third lines and the fourth lines, wherein a first portion of the third line located in the cell region and a second portion of the third line located over the contact plug contact the second line, and at least a part of a remainder of the third line is spaced apart from the second line. Through this, in the memory 1310 or the buffer memory 1340, operating characteristics and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 16-19 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. An electronic device comprising a semiconductor memory, the semiconductor memory comprising:
    a substrate including a cell region, a first peripheral circuit region disposed at a first side of the cell region in a first direction, and a second peripheral circuit region disposed at a second side of the cell region in a second direction crossing the first direction;
    a plurality of first lines disposed over the substrate and extending in the first direction across the cell region and the first peripheral circuit region;
    a plurality of second lines disposed over the first lines and extending in the second direction across the cell region and the second peripheral circuit region;
    a contact plug disposed in the second peripheral circuit region and having an upper surface coupled to a second line of the second lines;
    a plurality of third lines disposed over the second lines and respectively overlapping the second lines;
    a plurality of fourth lines disposed over the third lines and respectively overlapping the first lines;
    a plurality of first memory cells disposed in the cell region and located at intersections of the first lines and the second lines between the first lines and the second lines; and
    a plurality of second memory cells disposed in the cell region and located at intersections of the third lines and the fourth lines between the third lines and the fourth lines,
    wherein a first portion of a third line of the third lines located in the cell region and a second portion of the third line located over the contact plug contact the second line, and
    at least a part of a remainder of the third line is spaced apart from the second line.

2. The electronic device according to claim 1, wherein a space between the second line and at least the part of the remainder of the third line is filled with an insulating material.

3. The electronic device according to claim 1, wherein a height of the upper surface of the contact plug is equal to or higher than a height of an upper surface of a first memory cell of the first memory cells.

4. The electronic device according to claim 3, wherein the semiconductor memory further comprises:
an interlayer insulating layer disposed below the second lines, and
wherein a portion of the interlayer insulating layer in the second peripheral circuit region includes a recessed portion that is lower than the upper surface of the first memory cell and the upper surface of the contact plug.

5. The electronic device according to claim 4, wherein the interlayer insulating layer in the cell region has an upper surface that is substantially co-planar with the upper surface of the first memory cell.

6. The electronic device according to claim 4, wherein a height of the recessed portion decreases as a distance from the cell region increases over a first distance and increases as a distance from the cell region increases over a second distance.

7. The electronic device according to claim 4, wherein the second line is formed along the upper surface of the first memory cell, the upper surface of the contact plug, and an upper surface of the interlayer insulating layer.

8. The electronic device according to claim 7, wherein the second line has a recessed lower surface and a recessed upper surface over the recessed portion.

9. The electronic device according to claim 8, wherein the semiconductor memory further comprises:
an insulating material disposed over the recessed upper surface of the second line, the insulating material having an upper surface that has substantially the same height as an upper surface of the second line in the cell region.

10. The electronic device according to claim 9, wherein a lower surface of the third line contacts the upper surface of the second line in the cell region, the upper surface of the insulating material, and an upper surface of the second line over the contact plug.

11. The electronic device according to claim 4, wherein the interlayer insulating layer includes:
a cell insulating layer filled between the first memory cells in the cell region; and
a peripheral circuit insulating layer filled in the second peripheral circuit region,
wherein a thermal conductivity of the cell insulating layer is lower than a thermal conductivity of the peripheral circuit insulating layer.

12. The electronic device according to claim 11, wherein the first memory cell includes a phase change material.

13. The electronic device according to claim 1, wherein the third line, except for at least the part of the remainder of the third line, has a flat lower surface.

14. The electronic device according to claim 1, wherein the third line has a flat lower surface in the cell region and the second peripheral circuit region.

15. The electronic device according to claim 1, wherein the third line has a flat upper surface in the cell region and the second peripheral circuit region.

16. An electronic device comprising a semiconductor memory, the semiconductor memory comprising:
a substrate including a cell region, a first peripheral circuit region disposed at a first side of the cell region in a first direction, and a second peripheral circuit region disposed at a second side of the cell region in a second direction crossing the first direction;
a plurality of first lines disposed over the substrate and extending in the first direction across the cell region and the first peripheral circuit region;
a plurality of second lines disposed over the first lines and extending in the second direction across the cell region and the second peripheral circuit region;
a plurality of third lines disposed over the second lines and respectively overlapping the second lines, the third lines partially contacting the second lines in the second peripheral circuit region;
a plurality of fourth lines disposed over the third lines and respectively overlapping the first lines;
a plurality of first memory cells disposed in the cell region and located at intersections of the first lines and the second lines between the first lines and the second lines; and
a plurality of second memory cells disposed in the cell region and located at intersections of the third lines and the fourth lines between the third lines and the fourth lines,
wherein each of upper and lower surfaces of the second lines includes a protruding portion and a recessed portion in the second peripheral circuit region, and the third lines contact the protruding portion of the upper surface of the second lines.

* * * * *